(12) United States Patent
David et al.

(10) Patent No.: US 9,691,639 B2
(45) Date of Patent: Jun. 27, 2017

(54) PROCESS CONTAINER

(71) Applicant: Dürr Ecoclean GmbH, Filderstadt (DE)

(72) Inventors: Hermann-Josef David, Monschau (DE); Egon Käske, Aachen (DE)

(73) Assignee: Dürr Ecoclean GmbH, Filderstadt (DE)

( * ) Notice: Subject to any disclaimer, the term of this patent is extended or adjusted under 35 U.S.C. 154(b) by 689 days.

(21) Appl. No.: 13/649,845

(22) Filed: Oct. 11, 2012

(65) Prior Publication Data
US 2013/0034411 A1    Feb. 7, 2013

Related U.S. Application Data

(63) Continuation of application No. PCT/EP2011/057226, filed on May 5, 2011.

(30) Foreign Application Priority Data

May 11, 2010    (DE) ........................ 10 2010 028 883

(51) Int. Cl.
*H01L 21/67*      (2006.01)
*B08B 1/04*      (2006.01)
(Continued)

(52) U.S. Cl.
CPC .......... *H01L 21/67017* (2013.01); *B08B 1/04* (2013.01); *B08B 3/02* (2013.01);
(Continued)

(58) Field of Classification Search
CPC .............. B65G 65/365; A01F 25/2009; B65D 2543/00805; B65D 13/02; B65D 11/1866;
(Continued)

(56) References Cited

U.S. PATENT DOCUMENTS 424,102 A  *   3/1890   Edds .......................... B08B 3/02
                                                                                                                                                             134/102.1
1,970,783 A  *   8/1934   Walker ............... B01D 19/0057
                                                                                                                                                                       96/188

(Continued)

FOREIGN PATENT DOCUMENTS

CN            101134198 A     3/2008
DE             2049599 A1     4/1972
(Continued)

OTHER PUBLICATIONS

German Patent Office, "Search Report," issued in connection with German Patent Application No. 10 2010 028 883.7, and it's English translation, mailed on Nov. 6, 2012, 10 pages.

(Continued)

*Primary Examiner* — Glenn Myers
(74) *Attorney, Agent, or Firm* — Hanley, Flight & Zimmerman, LLC.

(57) ABSTRACT

In order to provide a process container for carrying out a cleaning process, a drying process, a deburring process, a coating process and/or a coating removal process on a workpiece in the interior of the process container, comprising a wall delimiting the interior of the process container, which is usable in a maintenance-friendly and flexible manner, it is proposed that the process container comprises at least one medium passage, by means of which a medium is guidable through the wall of the process container, at least two different process elements of different types being adaptable to at least one of the medium passages.

13 Claims, 27 Drawing Sheets

(51) Int. Cl.
*B08B 3/02* (2006.01)
*B08B 3/04* (2006.01)
*B08B 3/08* (2006.01)
*B08B 3/10* (2006.01)
*B08B 3/12* (2006.01)
*B08B 5/04* (2006.01)
*B08B 7/04* (2006.01)
*B65D 1/20* (2006.01)

(52) U.S. Cl.
CPC ............... *B08B 3/04* (2013.01); *B08B 3/08* (2013.01); *B08B 3/102* (2013.01); *B08B 3/12* (2013.01); *B08B 5/04* (2013.01); *B08B 7/04* (2013.01); *B65D 1/20* (2013.01)

(58) Field of Classification Search
CPC .. B65D 7/045; B65D 1/20; B08B 3/02; B08B 5/02; B29C 65/00; F17C 2205/0352; F17C 2205/0305; H01L 21/6708; H01L 21/67086; H01L 21/67051; H01L 21/67057; H01L 21/67011; H01L 21/67017; F26B 15/04
USPC ..................................... 248/310, 311.2, 318
See application file for complete search history.

(56) References Cited

U.S. PATENT DOCUMENTS

| | | | | |
|---|---|---|---|---|
| 2,841,136 | A * | 7/1958 | Pettit | B08B 3/02 126/350.1 |
| 3,784,455 | A * | 1/1974 | Parikh | C23F 1/46 204/202 |
| 4,027,686 | A * | 6/1977 | Shortes | H01L 21/67051 134/102.1 |
| 4,197,139 | A * | 4/1980 | Hjersted | C23G 1/36 134/12 |
| 4,483,697 | A * | 11/1984 | Deysson | B01D 19/0047 55/315 |
| 4,785,836 | A * | 11/1988 | Yamamoto | B08B 3/02 134/104.1 |
| 4,967,777 | A * | 11/1990 | Takayama | B08B 3/04 134/102.2 |
| 5,279,316 | A | 1/1994 | Miranda | |
| 5,669,401 | A * | 9/1997 | Mansur | B08B 3/006 134/105 |
| 5,921,257 | A * | 7/1999 | Weber | B01J 19/26 134/186 |
| 6,103,096 | A * | 8/2000 | Datta | C25F 7/00 204/212 |
| 6,199,568 | B1* | 3/2001 | Arai | B08B 3/102 134/186 |
| 6,225,235 | B1* | 5/2001 | Kunze-Concewitz | H01L 21/67051 156/345.21 |
| 6,235,147 | B1* | 5/2001 | Lee et al. | 156/345.21 |
| 6,321,760 | B1 | 11/2001 | Meissner | |
| 6,688,155 | B2* | 2/2004 | Ko | B08B 3/02 73/1.01 |
| 7,757,726 | B2* | 7/2010 | Handa | 141/82 |
| 2002/0189651 | A1* | 12/2002 | Radtke | H01L 21/67057 134/34 |
| 2003/0034250 | A1* | 2/2003 | Hey | H01L 21/67028 205/103 |
| 2003/0073309 | A1* | 4/2003 | Emami | H01L 21/6708 438/689 |
| 2003/0073310 | A1* | 4/2003 | Olgado | C25F 7/00 438/689 |
| 2003/0079835 | A1* | 5/2003 | Kajino | C03C 15/00 156/345.11 |
| 2003/0131648 | A1* | 7/2003 | Ko et al. | 73/1.01 |
| 2003/0168086 | A1* | 9/2003 | Yamaguchi | B08B 3/02 134/30 |
| 2003/0172964 | A1* | 9/2003 | Huang | B08B 3/02 134/200 |
| 2004/0000327 | A1* | 1/2004 | Somboli et al. | 134/21 |
| 2004/0089325 | A1* | 5/2004 | Park | B08B 3/02 134/26 |
| 2004/0216766 | A1* | 11/2004 | Wen | B08B 3/00 134/18 |
| 2006/0130880 | A1* | 6/2006 | Nagami | B08B 3/08 134/26 |
| 2006/0260642 | A1* | 11/2006 | Verhaverbeke et al. | 134/1.3 |
| 2007/0034562 | A1* | 2/2007 | Vernocchi et al. | 210/321.69 |
| 2007/0051393 | A1* | 3/2007 | Cho | H01L 21/67051 134/149 |
| 2008/0023444 | A1* | 1/2008 | Osawa | H01L 21/67086 216/83 |
| 2008/0251101 | A1* | 10/2008 | Ohno | B08B 3/02 134/4 |
| 2009/0056764 | A1* | 3/2009 | Minami | H01L 21/67028 134/27 |
| 2009/0056766 | A1* | 3/2009 | Nanba | H01L 21/67051 134/33 |
| 2009/0101181 | A1* | 4/2009 | Morisawa | H01L 21/67028 134/94.1 |
| 2009/0107519 | A1* | 4/2009 | Ishikawa | B08B 7/0042 134/1.3 |
| 2010/0095981 | A1* | 4/2010 | Kamikawa | H01L 21/67051 134/3 |
| 2010/0144158 | A1* | 6/2010 | Ito | H01L 21/67051 438/758 |

FOREIGN PATENT DOCUMENTS

| | | |
|---|---|---|
| DE | 36 04 694 A1 | 8/1987 |
| DE | 9115546 U1 | 2/1992 |
| DE | 4220827 A1 | 1/1994 |
| DE | 197 03 310 C1 | 4/1998 |
| DE | 202006013351 U1 | 10/2006 |
| DE | 102008049378 A1 | 4/2010 |
| EP | 1 655 082 | 5/2006 |

OTHER PUBLICATIONS

The State Intellectual Property Office of the People's Republic of China, Notification of the First Office Action, issued in connection with Chinese Application No. 201180023591.9, dated May 16, 2014, 13 pages. (with English translation).

International Searching Authority, "Search Report," issued in connection with International Application No. PCT/EP2011/057226, and it's English translation, mailed Jul. 19, 2011, 8 pages.

* cited by examiner

FIG. 23

PROCESS CONTAINER

RELATED APPLICATION

This application is a continuation application of International Application No. PCT/EP2011/057226 filed on May 5, 2011, which claims priority to German Patent Application No. 10 2010 028 883.7, filed May 11, 2010, both of which are hereby incorporated herein by reference in their entireties.

FIELD OF DISCLOSURE

The present invention relates to a process container for carrying out a cleaning process, a drying process, a deburring process, a coating process and/or a coating removal process on a workpiece in the interior of the process container, the process container comprising a wall delimiting the interior of the process container.

BACKGROUND

Process containers of this type are known, in particular for carrying out a flood washing process or a spray cleaning process.

The known process containers are not constructed in a maintenance-friendly manner and are in each case specially configured to carry out a single treatment process or a single sequence of treatment processes.

SUMMARY OF THE INVENTION

The present invention is based on the object of providing a process container of the aforementioned type, which is usable in a maintenance-friendly and flexible manner.

This object is achieved according to the invention with a process container having the features of the preamble of claim 1, in that the process container comprises at least one medium passage, by means of which a medium is guidable through the wall of the process container, at least two different process elements of different types being adaptable to at least one of the medium passages.

The term "medium" comprises here, in the context of this description and the accompanying claims, material whether in solid, liquid or gaseous form and also energy or information.

The medium that is guidable through the wall of the process container may thus, for example, be fluid material, in particular a cleaning medium with or without contamination, which is transportable through the relevant medium passage from an exterior of the process container into the interior thereof or from an interior into the exterior of the process container.

The medium may, however, also be energy, in particular electrical energy, which is introduced into the process container through the respective medium passage.

Furthermore, the medium may be information, for example in the form of measuring data or control signals, which is transportable by means of a corresponding data or signal line from the exterior of the process container into its interior or from the interior into the exterior of the process container.

A "process element" is basically to be taken to mean any element, which is used in a treatment process taking place in the process container.

In particular, a process element may be a treatment unit, a closure lid, a tool mounting or a workpiece mounting or workpiece support.

The process container can be easily and quickly configured to carry out different treatment processes owing to easy adaptation (connection) of process elements of different types to at least one of the medium passages of the process container.

One and the same process container can therefore be used for the most varied treatment processes and can therefore be used particularly flexibly.

By adapting suitable process elements, in each case, the process container according to the invention can be used, in particular, to carry out one or more of the following processes:

for a spray cleaning process;
for an immersion cleaning process;
for an injection flood washing cleaning process (during such an injection flood washing cleaning process, the process container is at least partially filled with a bath of a cleaning liquid, in which the workpiece to be cleaned is at least partially immersed, and a nozzle system produces a turbulent flow or a pulsating turbulent flow in the cleaning liquid bath in the process container);
for an ultrasonic cleaning process;
for a high pressure deburring process;
for a brush deburring process;
for a blow drying process;
for a vacuuming cleaning process; and/or
for a steam cleaning process.

The process container according to the invention is usable, in particular in a treatment device, which comprises a plurality of such process containers, which are preferably constructed identically to one another and are preferably configured by adapting process elements of different types to carry out different treatment processes.

A cleaning device of this type is therefore modularly constructed from a plurality of process containers and the respective process elements adapted to the medium passages of the process containers.

The process container according to the invention can therefore also be designated as a process module.

Furthermore, the process container according to the invention enables treatment devices to be produced for carrying out different treatment processes, in a simple manner saving assembly time and costs, from at least one respective process container according to the invention and at least one respective process element, which is adapted to a medium passage of at least one process container and is suitable to carry out the respective treatment process.

A process element, which is adaptable to a medium passage of a process container according to the invention, may, in particular, be a nozzle system, a high pressure application, a blowing element, a vacuum element or a deburring system.

The multi-functional process container according to the invention is suitable, in particular, for carrying out a cleaning process, a drying process, a deburring process, a coating process and/or a coating removal process.

At least one dead space-free connection, by means of which a process medium required for the treatment process and/or the energy required for a treatment process can be fed to the interior of the process container and/or can be removed from the interior of the process container, is preferably integrated into the process container.

It is preferably provided that at least one of the medium passages of the process container has a dead space-free adapter to adapt a process element.

The process container according to the invention is configurable particularly flexibly if it comprises at least two medium passages, which have adapters that are identical to one another. In this case, a process element with an adapter fitting it can be selectively adapted to various medium passages of the process container.

In order to also be able to carry out more complex treatment processes with a plurality of process elements, it is favourable if the process container comprises two or more medium passages.

In particular, it may be provided that the process container comprises three or more, in particular preferably four or more, medium passages.

In a preferred configuration of the process container, it is provided that at least two of the medium passages are arranged at substantially constant angular spacings with respect to a vertical centre axis of the process container.

Furthermore, it is provided in a preferred configuration of the invention that one of the medium passages opens into the interior of the process container at a lowest point of the interior of the process container. As a result, the process container can be configured to be self-emptying, as a medium located in the interior of the process container can discharge through such a medium passage out of the interior of the process container.

In a preferred configuration of the invention, the process container comprises a removable container upper part. After the removal of the container upper part, it is particularly easy to adapt a process element on the interior side to a medium passage of the process container, to maintain a process element of this type adapted on the interior side or to repair it or to exchange it for another process element.

Furthermore, after removing the container upper part, one or more process elements, which are adapted to a respective medium passage of the process container, are particularly easily accessible for a so-called "teaching" process, in which the movements, which the handling apparatus is to carry out automatically during normal operation of the treatment device, are carried out manually on a handling apparatus holding a workpiece to be treated.

The container upper part is preferably connected to a container lower part of the process container by means of a dead space-free sealing arrangement.

To allow easy and rapid transportation of a workpiece to be treated between the interior and the exterior of the process container, it is favourable if the process container has an access opening, through which a workpiece held on a handling apparatus is introducible into the interior of the process container.

An access opening of this type is preferably arranged on an upper side of the process container.

The process container is preferably configured in such a way that a reliable removal of particles and solids from the interior of the process container is ensured during the treatment process and, in the case of a cleaning process, no recontamination of the product being washed takes place.

The surfaces of the process container are preferably to be constituted in such a way that inclusions of particles and bacteria in the surfaces are prevented.

It may, in particular, be provided that the surface of the process container is configured to be self-cleaning at least on its inside.

To avoid inclusions on the wall of the process container, it is advantageous if the wall of the process container, at least on its inside, has a surface roughness of less than approximately 0.8 μm, at least in portions.

It is particularly favourable if the wall of the process container, at least on its inside, has a surface roughness of less than approximately 0.8 μm substantially everywhere.

The process container according to the invention is constructed in a particularly maintenance-friendly and inspection-friendly manner due to the ease of disassembly of the container upper part and/or other parts of the wall of the process container.

In order to prevent an unintentional escape of a medium from the interior of the process container into its exterior, it may be provided that at least one of the medium passages is closable by means of a closure lid adapted to an adapter of the medium passage.

Such a closure lid preferably has at least one upper delimiting face, which is inclined relative to the horizontal, so a deposition of media or contamination on the closure lid is avoided.

At least one medium passage of the process container preferably has an interior-side adapter to adapt to a process element.

Furthermore, at least one medium passage of the process container preferably has at least one exterior-side adapter to adapt to a process element.

In a preferred configuration of the invention it is provided that at least one medium passage of the process container has both an interior-side adapter to adapt to a process element and an exterior-side adapter to adapt to a process element.

In order to be able to deploy the process container particularly stably, it is favourable if the process container comprises a receiving element, by means of which the process container is supportable on an external bearing arrangement.

A receiving element of this type may, in particular, be substantially plate-like.

It is furthermore favourable if a receiving element of this type has at least one through-opening for the passage of a medium passage of the process container through the receiving element.

It may furthermore be provided that a receiving element of this type has at least one through-opening for the passage of a medium through the receiving element to at least one medium passage of the process container.

In order to securely connect the receiving element to the base body of the process container, it may be provided that at least one of the medium passages of the process container has an adapter arranged outside the interior of the process container to adapt the receiving element to the particular medium passage.

In a preferred configuration of the process container according to the invention, at least one of the medium passages of the process container has at least one mounting arranged on an external wall of the medium passage and in the interior of the process container to hold a treatment unit and/or a workpiece receiver.

Such a mounting is preferably arranged on a peripheral wall of a preferably tubular medium passage.

The process container according to the invention is suitable, in particular, for use in a combination of at least one process container according to the invention and at least two process elements of different types, which are selectively adaptable to the same medium passage of the process container. As a result, the process container can easily be configured to carry out different treatment processes by exchanging the process elements.

Furthermore, the process container according to the invention is suitable, in particular, for use in a combination of at least two process containers according to the invention and at least one process element, which is selectively adaptable to a medium passage of a first process container or to a medium passage of a second process container. A plurality of process containers according to the invention can thus be selectively configured by adapting the respectively required process element to carry out a desired treatment process.

A combination of at least one process container according to the invention and at least one process element that is adaptable to a medium passage of a process container according to the invention furthermore preferably comprises at least one handling apparatus to introduce a workpiece to be treated into the interior of at least one of the process containers.

A combination of this type of at least one process container, at least one process element and at least one handling apparatus forms a modularly constructed treatment device.

A combination of at least one process container according to the invention and at least one process element that is adaptable to a medium passage of a process container of this type, preferably comprises, as the process element, a spray cleaning unit, an injection flood washing unit, an ultrasonic cleaning unit, a high pressure deburring unit, a brush deburring unit, a blow drying unit, a steam cleaning unit, a suction unit, a ventilation unit, a workpiece receiver, a workpiece movement unit and/or a liquid curtain generating unit.

Furthermore, it may be provided that the process container according to the invention comprises at least one reflection surface for reflecting ultrasonic waves into the interior of the process container.

It is favourable if the process container comprises a vacuum-tight lid for carrying out a treatment process under a vacuum.

Such a vacuum-tight lid may, in particular, be pivotably mounted.

It is furthermore favourable if the process container according to the invention comprises a guide element, for example a guide plate, which directs a process medium that does not reach a workpiece to be treated and/or a process medium (a so-called over-spray) rebounding from a workpiece to be treated at least partially into the interior of the process container.

The handling apparatus may, in particular, be configured as a robot.

The handling apparatus preferably has a gripping device for gripping the workpiece.

The handling apparatus preferably has at least three, particularly preferably at least four, in particular at least five, for example at least six, degrees of freedom of movement.

The handling apparatus preferably has a "teaching" mode, in which movements, which the handling apparatus is to carry out automatically during normal operation of the handling apparatus, are carried out manually on the handling apparatus and are thereby stored for subsequent implementation.

Further features and advantages of the invention are the subject of the following description and the graphical presentation of embodiments.

BRIEF DESCRIPTION OF THE DRAWINGS

FIG. 23 shows a schematic section through a process container with a workpiece rotation mechanism arranged therein and a treatment unit for carrying out a spray cleaning process;

The same or functionally equivalent elements are designated by the same reference numerals in all the figures.

DETAILED DESCRIPTION OF THE INVENTION

Figure 1:
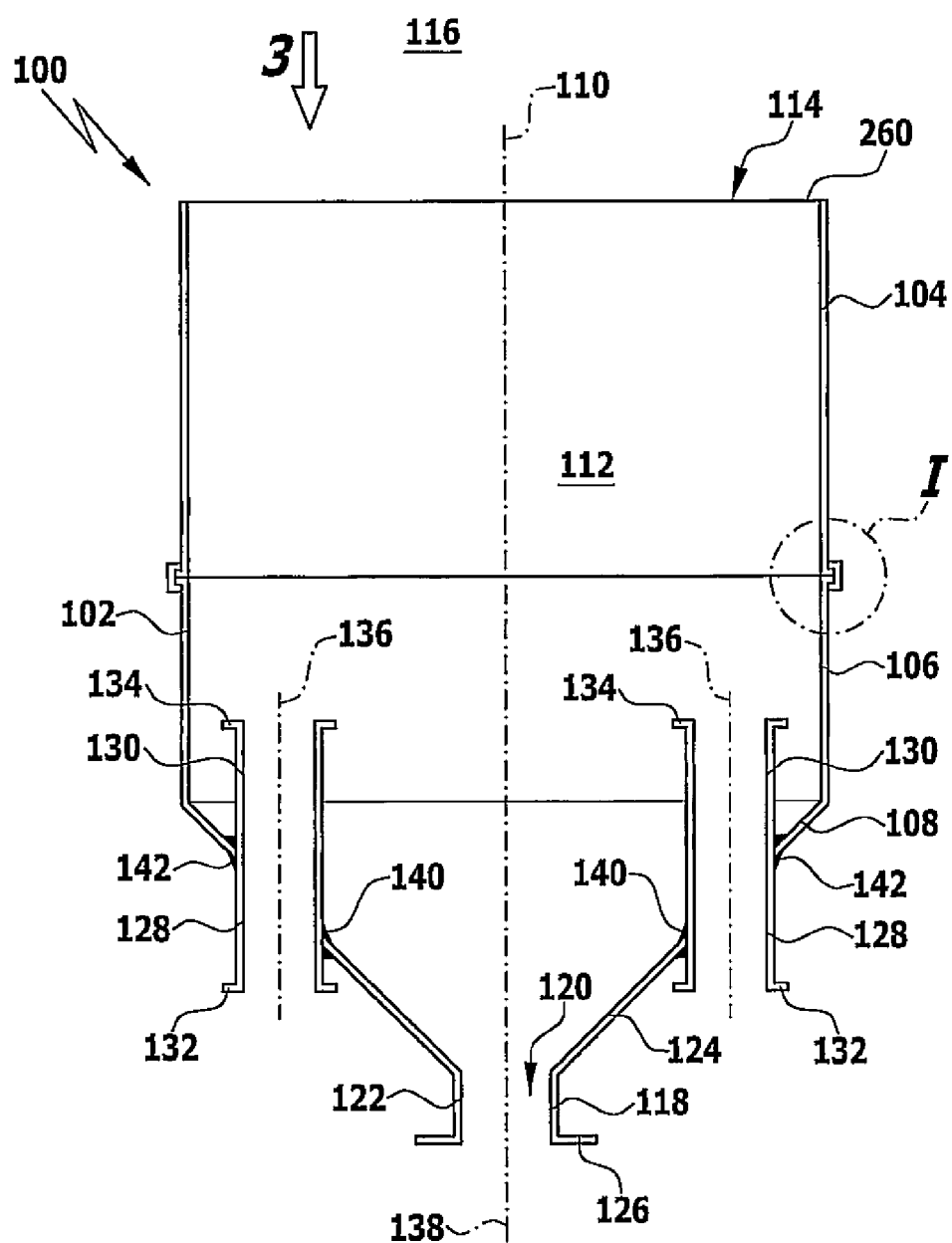
FIG. 1 shows a schematic vertical section through a process container with a central medium passage, which opens into the process container at the lowest point of the interior of the process container, and with three further medium passages, which are equidistantly distributed above the central medium passage along the periphery of the process container (only two of these upper medium passages being visible in FIG. 1)

A process container designated 100 as a whole, shown separately in FIG. 1 to and in FIG. 6 to 27 in various configurations with treatment units, workpiece receivers and handling devices, comprises a container lower part 102 and a container upper part 104 removably placed on the container lower part 102 (see, in particular, FIG. 1).

The container lower part 102 comprises a substantially hollow cylindrical upper portion 106 and a substantially frusto-conical lower portion 108 tapering conically downward.

The container lower part 102 and the container upper part 104 are substantially rotationally symmetrical with respect to the process container's central centre axis 110, which is substantially vertically oriented in the operating state of the process container 100.

The container lower part 102 and the container upper part 104 together surround an interior 112 of the process container 100, which is accessible by means of an access opening 114 at the upper edge 260 of the container upper part 104 from an exterior 116 of the process container 100.

At the lowest point of the interior 112, a lower medium passage 118 opens at a mouth opening 120 into the interior 112.

The lower medium passage 118 is, for example, substantially tubular and comprises a hollow cylindrical wall 122, which merges at the mouth opening 120, preferably seamlessly, into the wall 124 of the container lower part 102, and an exterior-side adapter 126 arranged at the lower edge of the hollow cylindrical wall 122 for adapting (connecting) process elements, in particular feed or discharge lines.

Furthermore, the process container 100 comprises a plurality of, for example three, upper medium passages 128, which in each case extend through the wall 124 of the lower portion 108 of the container lower part 102.

Each of the upper medium passages 128 is, for example, substantially tubular and comprises a hollow cylindrical wall 130, an exterior-side adapter 132 arranged at the lower edge of the hollow cylindrical wall 130 for adapting (connecting) process elements, in particular feed or discharge lines, or for adapting a receiving plate, and an interior-side adapter 134 arranged on an upper edge of the hollow cylindrical wall 130 for adapting (connecting) process elements, in particular treatment units or a closure lid.

The longitudinal centre axes 136 of the upper medium passages 128 and the longitudinal centre axis 138 of the lower medium passage 118, which preferably coincides with the centre axis 110 of the process container 100, are preferably oriented substantially parallel to one another and preferably substantially vertically.

The container lower part 102, the container upper part 104, the lower medium passage 118 and/or the upper medium passages 128 of the process container 100 are preferably formed from a metallic material, in particular from a steel material, preferably from a high-grade steel material.

The upper medium passages 128 are integrally connected at their outside, in particular by welding, preferably by laser welding, to the wall 124 of the container lower part 102 where they pass through the wall 124.

It may, in particular, be provided that the outside of each upper medium passage 128 is integrally connected to the wall 124 along an inner weld seam 140 running round the relevant upper medium passage 128 on the inside of the wall 124 and by an outer weld seam 142 running round the respective upper medium passage 128 on the outside of the wall 124.

At least the surfaces, which face the interior 112 of the process container 100, of the container lower part 102, the container upper part 104 and the upper medium passages 128 as well as the internal faces of the upper medium passages 128 and the lower medium passage 118, preferably have a surface composition such that inclusions of particles and bacteria in these surfaces are prevented.

In particular, it may be provided that these surfaces have a surface roughness (also called roughness depth) of less than 0.8 μm.

Figure 2:
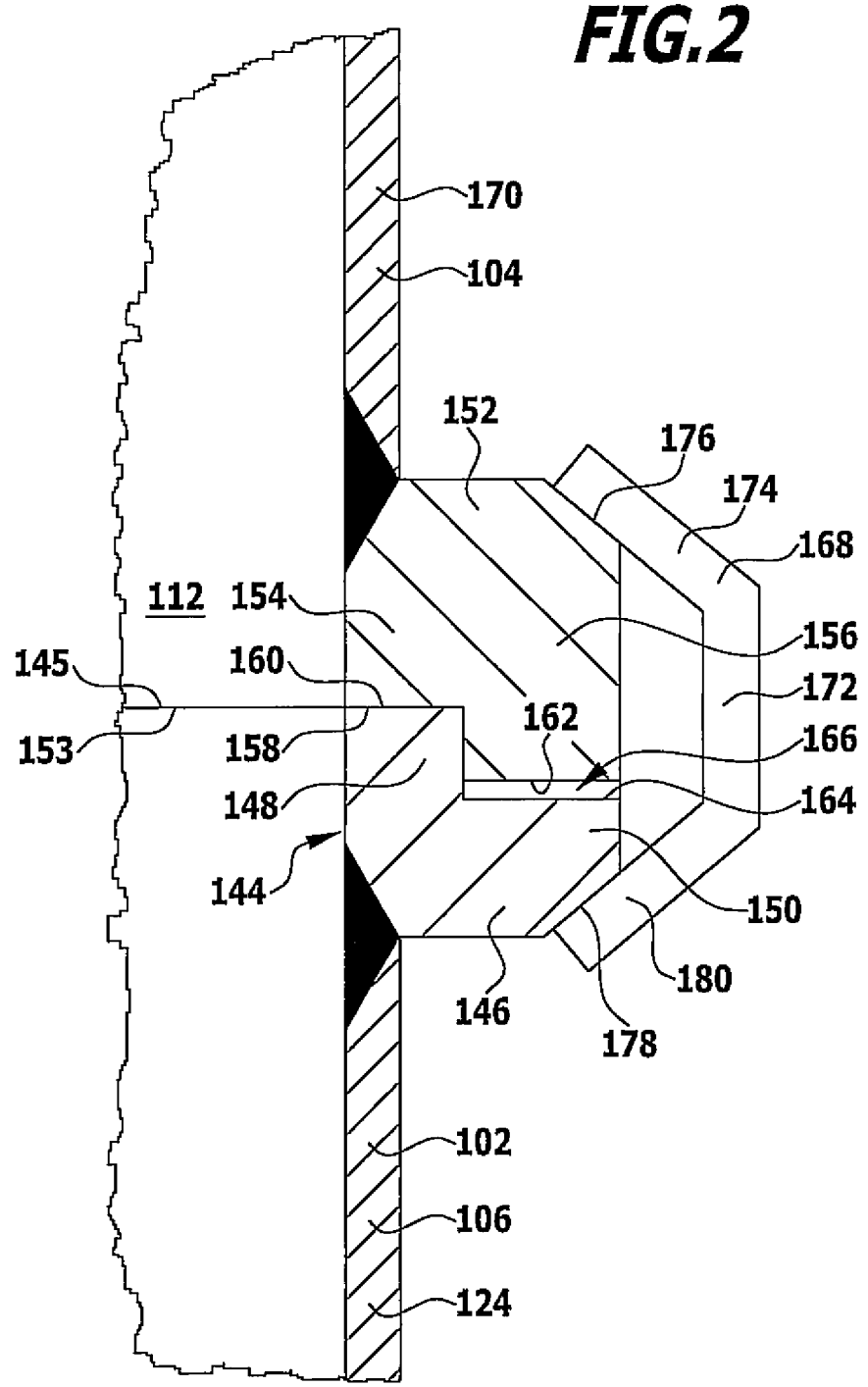
FIG. 2 shows an enlarged view of the region I from FIG. 1, which shows a connecting region between a lower part and a removable upper part of the process container.

The container lower part 102 and the removable container upper part 104 are connected to one another by a dead space-free and gap-free sealing arrangement 144, which is designated 144 as a whole and is shown in detail in FIG. 2.

The sealing arrangement 144 comprises a stepped support flange 146, which is arranged at the upper edge 145 of the container lower part 102, with an upwardly projecting radially inner portion 148 and a lower radially outer portion 150 and a bearing flange 152, which is stepped in a manner complementary to the support flange 146, is arranged at a lower edge 153 of the container upper part 104 and comprises a shorter radially inner portion 154 and a longer radially outer portion 156 projecting downwardly toward the container lower part 102.

The radially inner portion 154 of the bearing flange 152 abuts with its lower side, which forms an upper sealing face 158 of the sealing arrangement 144, flat on an upper side of the radially inner portion 148 of the support flange 146, which forms a lower sealing face 160 of the sealing arrangement 144.

Toward the interior 112 of the process container 100, the support flange 146 and the bearing flange 152 are configured substantially with the surfaces flush so no dead space in the form of a radially outwardly extending recess or a radially outwardly extending gap, in which contaminants could settle, is formed in the sealing arrangement 144.

On the other hand, a gap 166 is preferably formed between the lower side 162 of the radially outer portion 156 of the bearing flange 152 and the upper side 164 of the radially outer portion 150 of the support flange 146, in order to allow a tolerance compensation at this point, which no contaminants from the interior 112 can reach.

The support flange 146 and the bearing flange 152 are clamped against one another by means of a clamping element 168 annularly surrounding the process container 100 and positively held against one another.

The clamping element 168 may comprise a central centre portion 172 oriented substantially parallel to the wall 124 of the upper portion 106 of the container lower part 102 and parallel to the wall 170 of the container upper part 104, as well as an upper portion 174, which is preferably oriented obliquely with respect to the vertical and obliquely with respect to the horizontal and which abuts on a contact slope 176 of the radially outer portion 156 of the bearing flange 152, and a lower portion 178, which is also preferably oriented obliquely with respect to the horizontal and obliquely with respect to the vertical and which abuts on a contact slope 180 of the radially outer portion 150 of the support flange 146.

Figure 5:
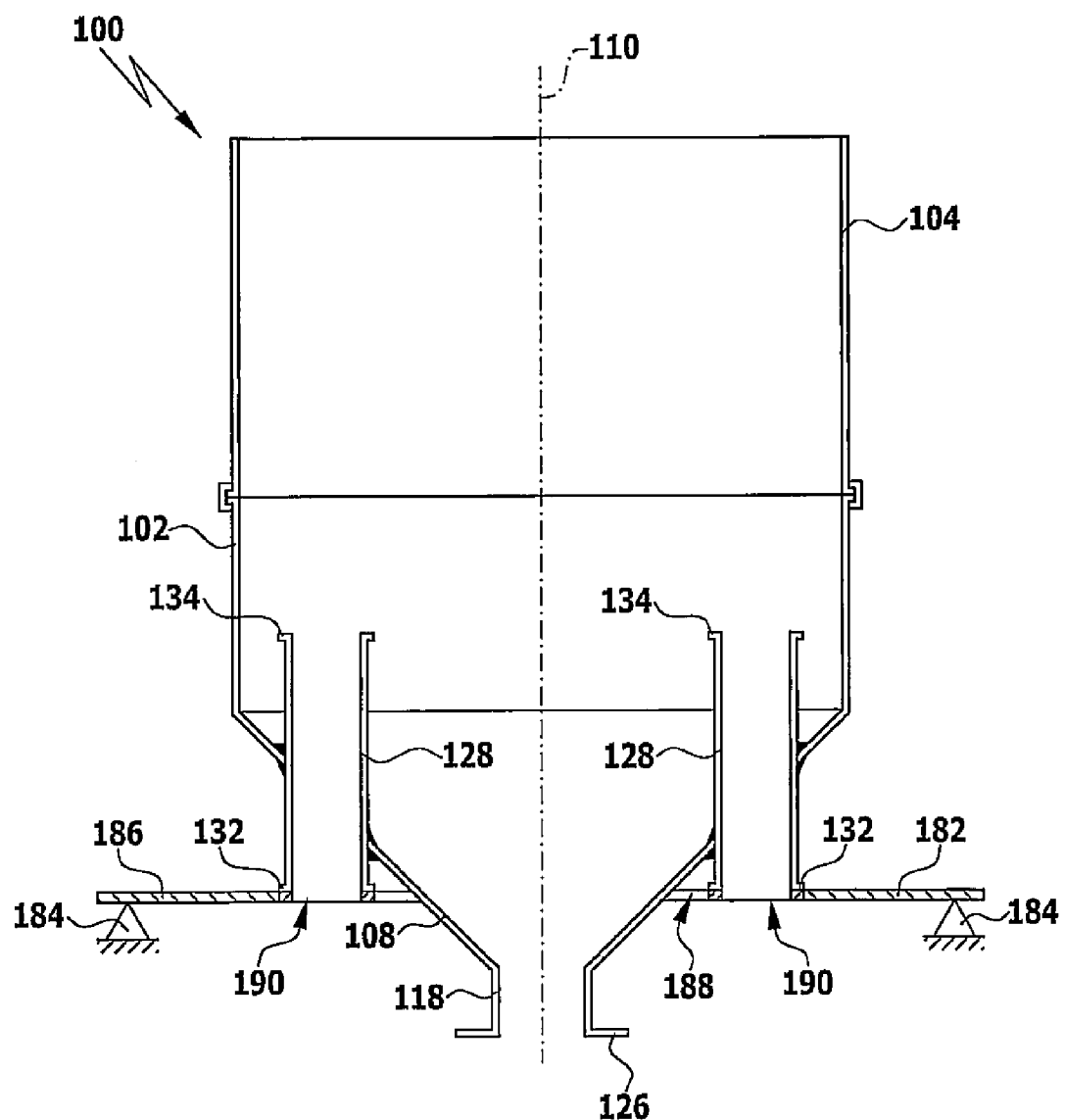
FIG. 5 shows a variant of the process container of FIG. 1, which additionally comprises a receiving plate, with which the process container is supported on an external bearing arrangement.

In order to stably deploy the process container 100, said process container may be provided with a receiving element 182, by means of which the process container 100 is supportable on an external mounting arrangement 184 (see FIG. 5).

The receiving element 182 may, in particular, be configured as a substantially annular receiving plate 186, which has a central through-opening 188 for the passage of the lower portion 108 of the container lower part 102 through the receiving plate 186 and a number of medium through-openings 190 corresponding to the number of upper medium passages 128.

The medium through-openings 190 are arranged here on the receiving plate 186 in such a way that they align with the interiors of the respectively associated upper medium passages 128 of the process container 100 when the receiving plate 186 is adapted (connected) to the exterior-side adapter 132 of the upper medium passages 128 of the process container 100.

The bearing arrangements 184 may basically be of any desired type; for example, these may be bearing elements of a treatment device, of which the process container 100 forms a component.

Figure 6:
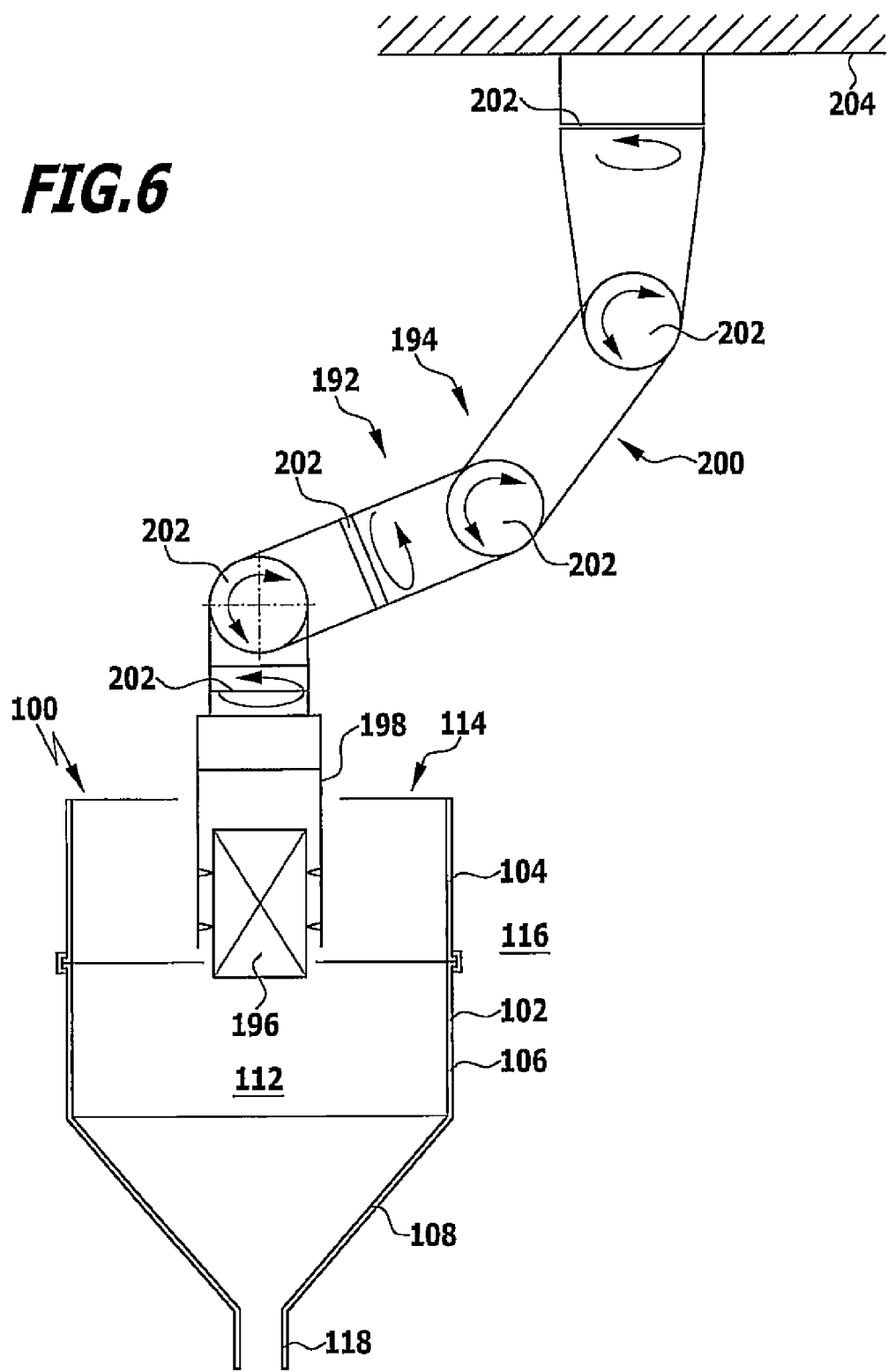
FIG. 6 shows a schematic side view of a handling apparatus, which introduces a workpiece to be treated through an upper access opening of the process container into the interior of the process container.

FIG. 6 schematically shows a treatment device, which, in addition to the process container 100, comprises a handling apparatus 192, for example in the form of a robot 194, by means of which a workpiece 196 to be treated is introducible into the interior 112 of the process container 100.

The handling apparatus 192 has a gripping device 198 for gripping and fixing the workpiece 196 and a robot arm 200 with a plurality of rotary joints 202, for example with six rotary joints 202.

In the embodiment shown in FIG. 6, the robot arm 200 is fastened to a wall of the treatment device, for example to a cover wall 204, so the number of rotary joints 202 of the robot arm 200 corresponds to the number of degrees of freedom of movement of the handling apparatus 192.

In the embodiment shown, the number of degrees of freedom of movement of the handling apparatus 192 is six.

The number of degrees of freedom of movement of the handling apparatus 192 is preferably at least three, particularly preferably at least four, in particular at least five.

By means of the handling apparatus 192, a workpiece 196 can be received in the exterior 116 of the process container 100, introduced for a treatment process into the interior 112 of the process container 100 and removed from the process container 100 after the completed treatment.

After removal from the process container 100, the workpiece 196 can be introduced into one or more further process containers 100 of the treatment device for further treatment processes.

After completion of the last treatment process, the workpiece 196 can be deposited by the handling device 192 on a workpiece placement area or on a workpiece transporting device (not shown).

It is also possible for the treatment device to comprise a plurality of handling apparatuses 192, which pick up the workpiece 196 one after the other, introduce said workpiece into the interior 112 of at least one process container 100 and, after a treatment process in the interior 112 of a process container 100, move it out from the process container 100 again.

The above-described process container 100 may be used multi-functionally, in that other process elements 205, for example treatment units 206 (see, for example, FIG. 7), are in each case arranged in the interior 112 of the respective process container 100 in order to carry out a respective specific treatment on a workpiece 196.

Figure 7:
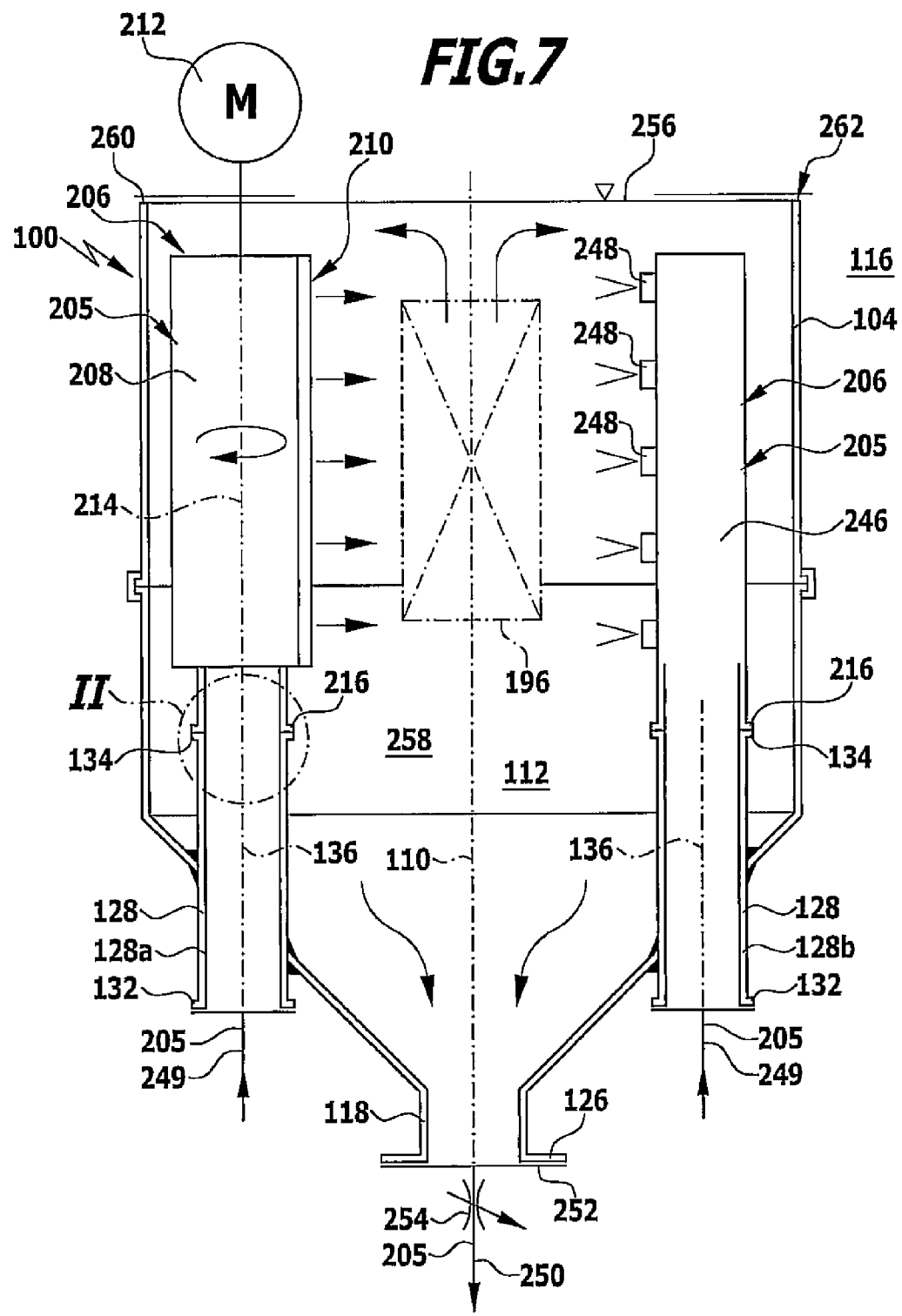
FIG. 7 shows a schematic vertical section through a process container with treatment units for carrying out an injection flood washing process, which may be a continuous injection flood washing process (with uninterrupted generation of a turbulent flow by means of nozzles) or a pulsating injection flood washing process (with intermittent generation of a turbulent flow by means of nozzles)

Thus, for example, the process container 100 shown in FIG. 7 is, for example, equipped to carry out an injection flood washing process.

For this purpose, a treatment unit 206 in the form of a movable nozzle system 208 is adapted to the interior-side adapter 134 of one of the upper medium passages 128 of the process container 100, for example a first upper medium passage 128a, as the process element 205.

The movable nozzle system 208, for example, comprises a slit nozzle 210, through which a liquid washing medium can be directed in a targeted manner onto a workpiece 196, which is held by means of a handling apparatus 192 (not shown in FIG. 7) in the interior 112 of the process container 100.

The slit nozzle 210 is rotatable by means of a motor, pneumatic or hydraulic rotary drive 212 about a rotational axis 204, which preferably coincides with the longitudinal centre axis 136 of the relevant upper medium passage 128a.

The treatment unit 206, for connection to the interior-side adapter 134 of the upper medium passage 128, comprises an adapter 216 arranged on the lower side of the treatment unit 206.

Figure 8:
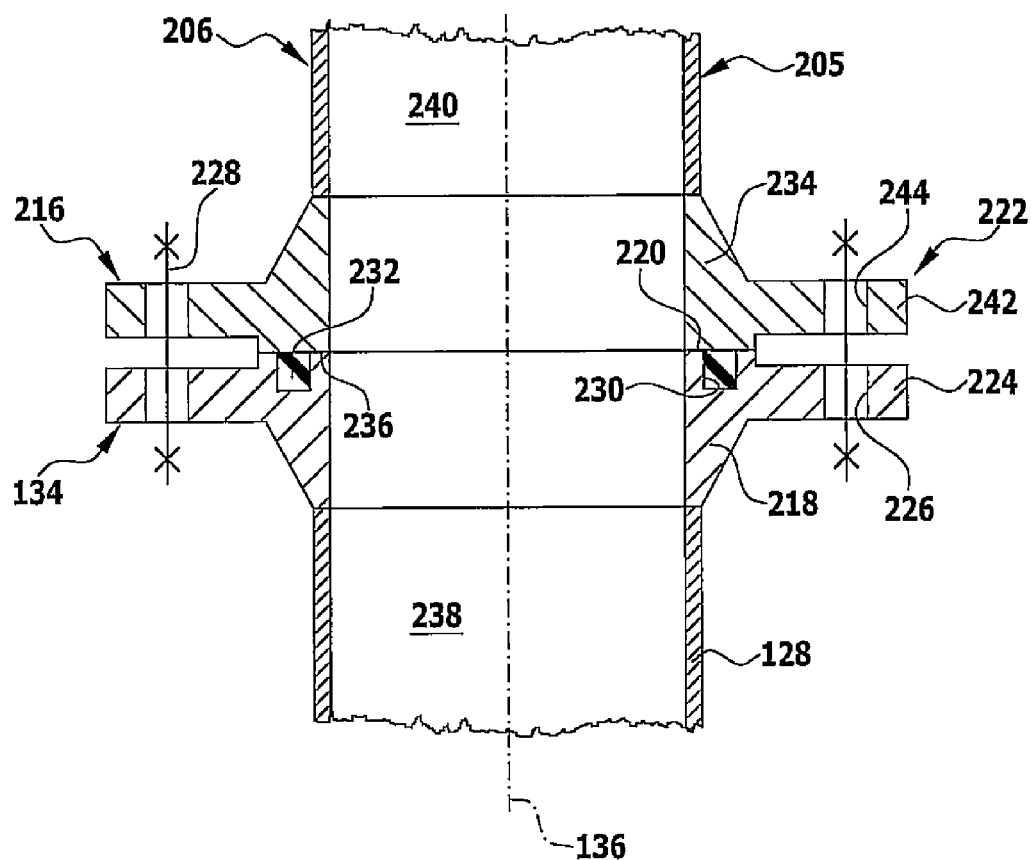
FIG. 8 shows an enlarged view of the region II from FIG. 7, which shows the connection between an interior-side adapter of a medium passage of the process container and an adapter matched therewith of a treatment unit.

In FIG. 8, the adapter 216 and the interior-side adapter 134 of the upper medium passage 128 on the interior side cooperating with the latter is shown in detail.

The interior-side adapter 134 of the upper medium passage 128 comprises a radially inner, annular support portion 218, the upper side of which forms a lower sealing face 220 of the sealing arrangement 222 formed by the two adapters 134 and 216.

A radially outer, annular fastening portion 224 of the interior-side adapter 134, which projects outwardly in the radial direction from the support portion 218, is arranged spaced apart downwardly from the lower sealing face 220 in the direction of the longitudinal centre axis 136 of the upper medium passage 136.

A plurality of, for example at least three, through-bores 226 for the passage of one respective fastening means 228 (shown only purely schematically by its longitudinal axis in FIG. 8), for example a respective fastening screw, are provided in the fastening portion 224, substantially parallel to the longitudinal centre axis 136 of the upper medium passage 128.

The through-bores 226 are preferably arranged along the periphery of the fastening portion 224 at constant angular spacings with respect to the longitudinal centre axis 136.

An annular groove 230, in which an annular sealing element 232, preferably made of elastomeric material, is arranged, opens at the lower sealing face 220 of the support portion 218.

The adapter 216 of the treatment unit 206 comprises a radially inner, annular bearing portion 234, the lower side of which forms an upper sealing face 236 of the sealing arrangement 222 and abuts flat on the lower sealing face 220, the annular sealing element 232 being pressed with resilient bias against the upper sealing face 236 and therefore forming an annular sealing line.

The radially inner delimiting walls of the bearing portion 234 of the adapter 216 and the support portion 218 of the interior-side adapter 134 substantially align with one another, so the interior 238 of the upper medium passage 128 and the interior 240 of the treatment unit 206 merge smoothly and steplessly into one another at their edges and the sealing arrangement 222 is dead space-free and gap-free.

The adapter 216 of the treatment unit 206 furthermore comprises a radially outer, annular fastening portion 242, which is upwardly offset in relation to the upper sealing face 236 in the direction of the longitudinal centre axis 136 and projects outwardly from the bearing portion 234 of the adapter 216 in the radial direction and is provided with a plurality of, for example with at least three, through-bores 244 for the passage of a respective fastening means 228 through the fastening portion 242.

The through-bores 244 in the fastening portion 242 of the adapter 216 of the treatment unit 206, in the assembled state of the treatment unit 206, are arranged substantially aligned with the through-bores 226 in the fastening portion 224 of the interior-side adapter 134 of the respectively associated upper medium passage 128, so a respective fastening means 228 extends through a through-bore 244 in the adapter 216 and a through-bore 226 in the adapter 134.

Each of the fastening means 228 may be locked by a locking means, for example by means of a fastening nut (not shown), in its position on the fastening portions 224 and 242 and secured against moving out of the through-bores 226 and 244.

The adapter 216 of the treatment unit 206 and the adapter 134 of the medium passage 128 can therefore be clamped against one another by the fastening means 228 and the respectively associated locking means.

As the interior-side adapters 134 of all the upper medium passages 128 of the process container 100 are identical to one another, the treatment unit 206 can be adapted (connected) by the adapter 216 to any of the above medium passages 128.

A treatment device preferably has a plurality of process containers 100 with upper medium passages 128, the interior-side adapters 134 of which are identical to one another, so one and the same treatment unit 206 are adaptable to the upper medium passages 128 of various process containers 100.

Various process elements 205, in particular treatment units 206, preferably furthermore have adapters 216 that are identical to one another, so these various process elements 205, in particular treatment units 206, can be selectively adapted to the same upper medium passage 128 of the process container 100.

These process elements 205, in particular treatment units 206, may preferably be configured differently, so different types of treatments can be carried out with the various process elements 205, in particular treatment units 206, on a workpiece 196.

In the configuration of the process container 100 shown in FIG. 7 for an injection flood washing process, a rigid nozzle system 246 can be adapted to a second upper medium passage 128*b*, as a process element 205 and treatment unit 206.

In this case, the rigid nozzle system 246, as the process element 205, has an adapter 216, which is identical to the adapter 216, already described above, of the movable nozzle system 208, so this adapter 216 is adaptable to the interior-side adapter 134 of the second upper medium passage 128*b*, which is identical to the interior-side adapter 134 of the first upper medium passage 128*a*.

The rigid nozzle system 246 has a plurality of, for example five, washing medium nozzles 248, by means of which there is producible a respective washing medium jet directed onto the workpiece 196.

The washing medium nozzles 248 are preferably spaced apart from one another in the direction of the longitudinal centre axis 136 of the upper medium passage 128*b*.

The third upper medium passage 128*c* (see FIG. 3), (which is not shown in FIG. 7), can be provided with a further movable nozzle system 208 or a further rigid nozzle system 246.

A washing medium feed line 249 is adapted, in each case, to the exterior-side adapter 132 of all the three upper medium passages 128 of the process container 100 in the configuration shown in FIG. 7.

In this case, each exterior-side adapter 132 of an upper medium passage 128 is, for example, configured mirror symmetrically with respect to the interior-side adapter 134 shown in FIG. 8.

The adapter (not shown) of each washing medium feed line 249 is preferably substantially mirror symmetrical with respect to the adapter 216, shown in FIG. 8, of the treatment unit 206.

A washing medium discharge large 250 is adapted, in the configuration shown in FIG. 7, to the exterior-side adapter 126 of the lower medium passage 118 of the process container 100.

In this case, the (exterior-side) adapter 126 of the lower medium passage 118 can be configured substantially the same as the exterior-side adapter 132 of the upper medium passages 128 and the adapter 252 of the washing medium discharge line 250 is preferably configured substantially the same as the adapter of the washing medium feed lines 249.

A check valve 254 with an adjustable flow cross-section can be arranged in the washing medium discharge line 250.

By closing the check valve 254, the interior 112 of the process container 100 can firstly be filled with the washing medium by feeding the washing medium by means of the washing medium feed lines 249 and the nozzle systems 208 and 246 until the bath level 256 of a washing medium bath 258 in the interior 112 of the process container 100 reaches the upper edge 260 of the container upper part 104 and with further feeding of washing medium to the interior 112 or upon immersion of a workpiece 196 in the washing medium bath 258, excess washing medium passes over the upper edge 260 serving as an overflow 262 and flows away into a washing medium collecting basin (not shown).

Floating particles and oils having a lower density than the washing medium can be removed from the interior 112 of the process container 100 by this overflow of the washing medium over the upper edge 260 of the process container 100.

Heavy dirt particles, on the other hand, sink downwardly in the washing medium bath 258 and are discharged through the lower medium passage 118 and the washing medium discharge line 250, once the check valve 254 has been opened.

The workpiece 196 immersed in the washing medium bath 258 (preferably substantially completely) is subjected to an injection flood washing process by means of the generation of washing medium jets directed onto the workpiece 196 within the washing medium bath 258.

Figure 9:
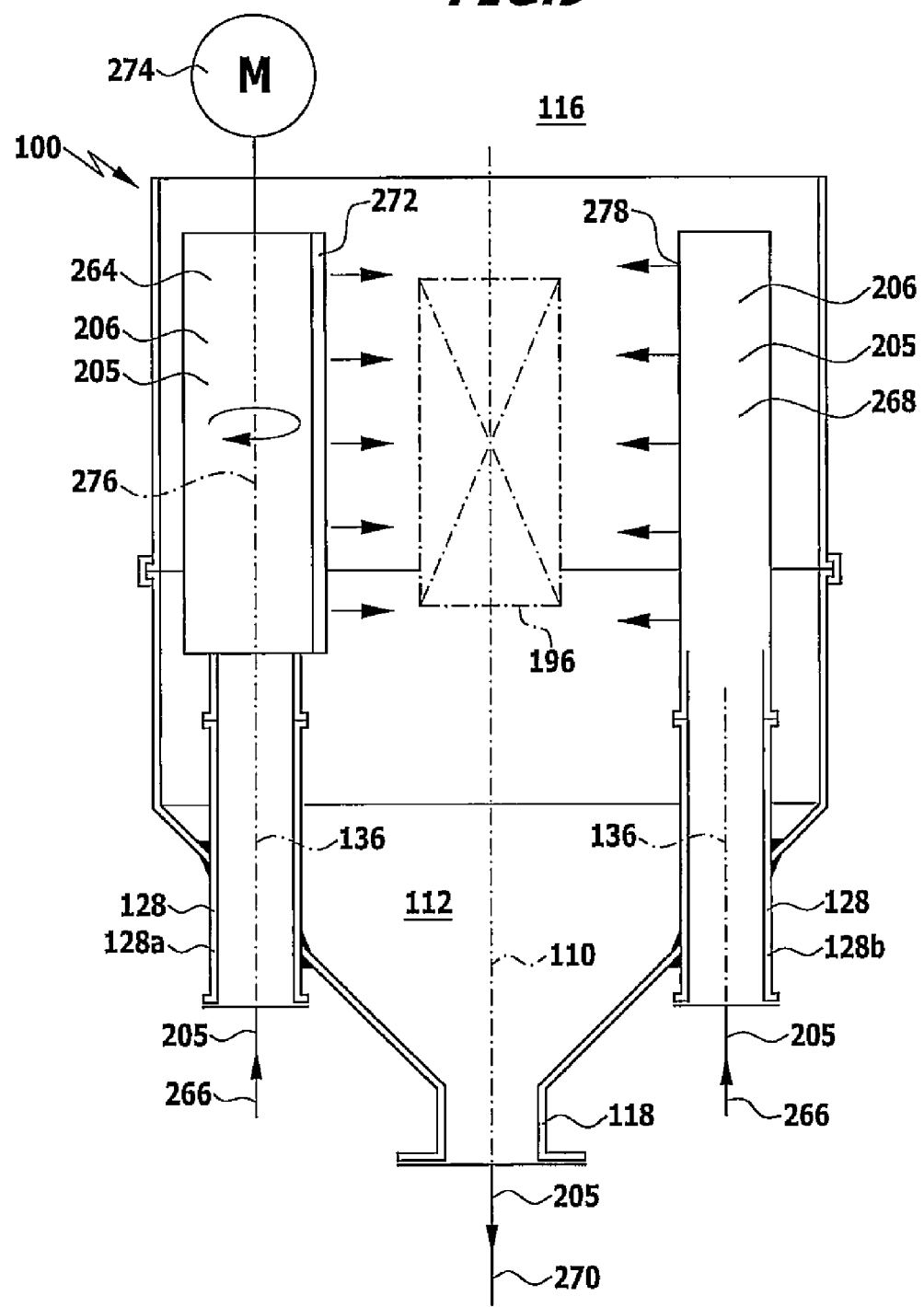
FIG. 9 shows a schematic section through a process container with treatment units arranged therein for carrying out a blowing process.

In an alternative configuration of the process container 100 shown in FIG. 9, the latter is used to carry out a blowing process on a workpiece 196.

For this purpose, a movable blow nozzle system 264, as the process element 205 and treatment unit 206, is adapted on the interior side to the first upper medium passage 128a and a blow air feed line 266 is adapted, as the process element 205, on the exterior side.

A rigid blow nozzle system 268, as the process element 205 and treatment unit 206, is adapted ion the interior side to the second upper medium passage 128b and a blow air feed line 226, as the process element 205, is also adapted on the exterior side.

The third upper medium passage 128 (not shown) may be provided with a movable blow nozzle system 264 or with a rigid blow nozzle system 268.

The lower medium passage 118 is connected on the exterior side to a discharge line 270 for dirt particles and liquid blown off from the workpiece 196, as the process element 205.

The movable blow nozzles 264 may have a slit nozzle 272, by means of which there is producible a blow air jet directed against the workpiece 196 and by means of which a motor rotary drive 274 is rotatable about a rotational axis 276 preferably running parallel to the longitudinal centre axis 136 of the upper medium passage 128a.

The rigid blow nozzle system 268 is provided with a plurality of, for example five, blow air nozzles 278, with which there is producible a respective blow air jet directed against the workpiece 196.

The blow air nozzles 278 are preferably arranged spaced apart from one another along the longitudinal centre axis 136 of the respectively associated upper medium passage 128.

Figure 10:
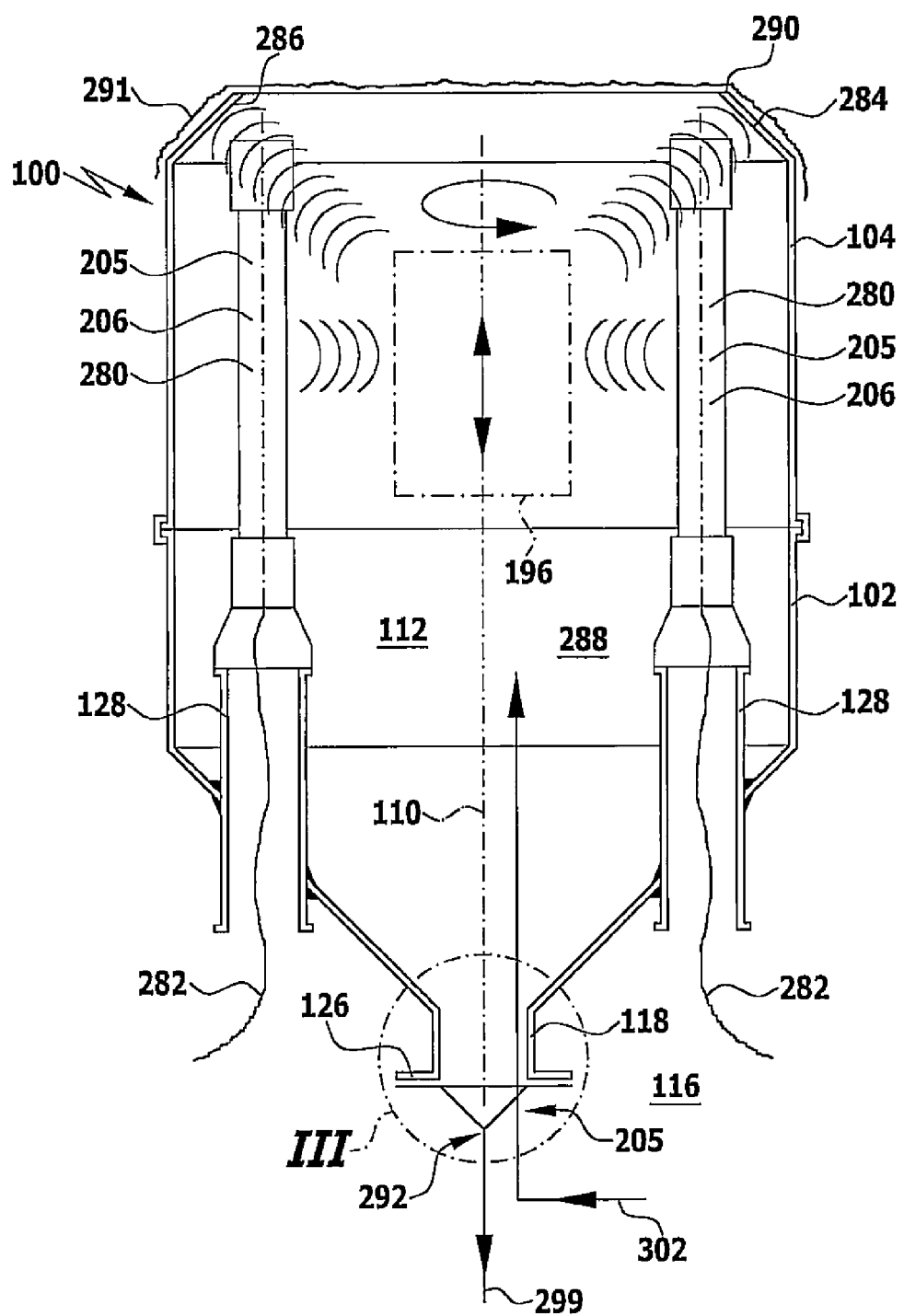
FIG. 10 shows a schematic section through a process container with treatment units arranged therein for carrying out an ultrasonic cleaning process.

In an alternative configuration shown in FIG. 10, the process container 100 is used to carry out an ultrasonic cleaning process on a workpiece 196.

For this purpose, a respective ultrasonic oscillator 280 is adapted on the interior side to each of the upper medium passages 128 of the process container 100, as the process element 205 and treatment unit 206.

An energy feed line 282 extends, in each case, in this embodiment through each of the upper medium passages 128 to the respectively associated ultrasonic oscillator 280.

In this configuration of the process container 100, electrical energy therefore forms the medium, which is guided through the upper medium passages 128 from the exterior 116 into the interior 112 of the process container 100.

The workpiece 196 arranged in the region between the ultrasonic oscillators 280 is preferably moved up and down and/or rotated, preferably by means of the handling apparatus 192 in this use of the process container 100 so that all the surfaces of the workpiece 196 are acted upon by the ultrasonic waves, which are generated by means of the ultrasonic oscillators 280.

So that ultrasonic waves generated by the ultrasonic oscillators 280 and firstly directed away from the workpiece 196 are also reflected toward the workpiece 196, the process container 100 in this configuration is provided with an annular reflection screen 284, which is placed on the container upper part 104, the inside of said screen (which is, for example, substantially frusto-conical) forming a reflection surface 286 for the ultrasonic waves.

A cleaning medium bath 288, with which the process container 100 is filled up to the upper edge 290 of the reflection screen 284, which forms an overflow for the cleaning medium, is used in this configuration as the medium for transmitting the ultrasonic waves from the ultrasonic oscillator 280 to the workpiece 196.

Floating substances and oils (designated 291 schematically in FIG. 10), which have a lower density than the cleaning medium, are discharged by means of this overflow from the interior 112 of the process container 100.

Figure 11:
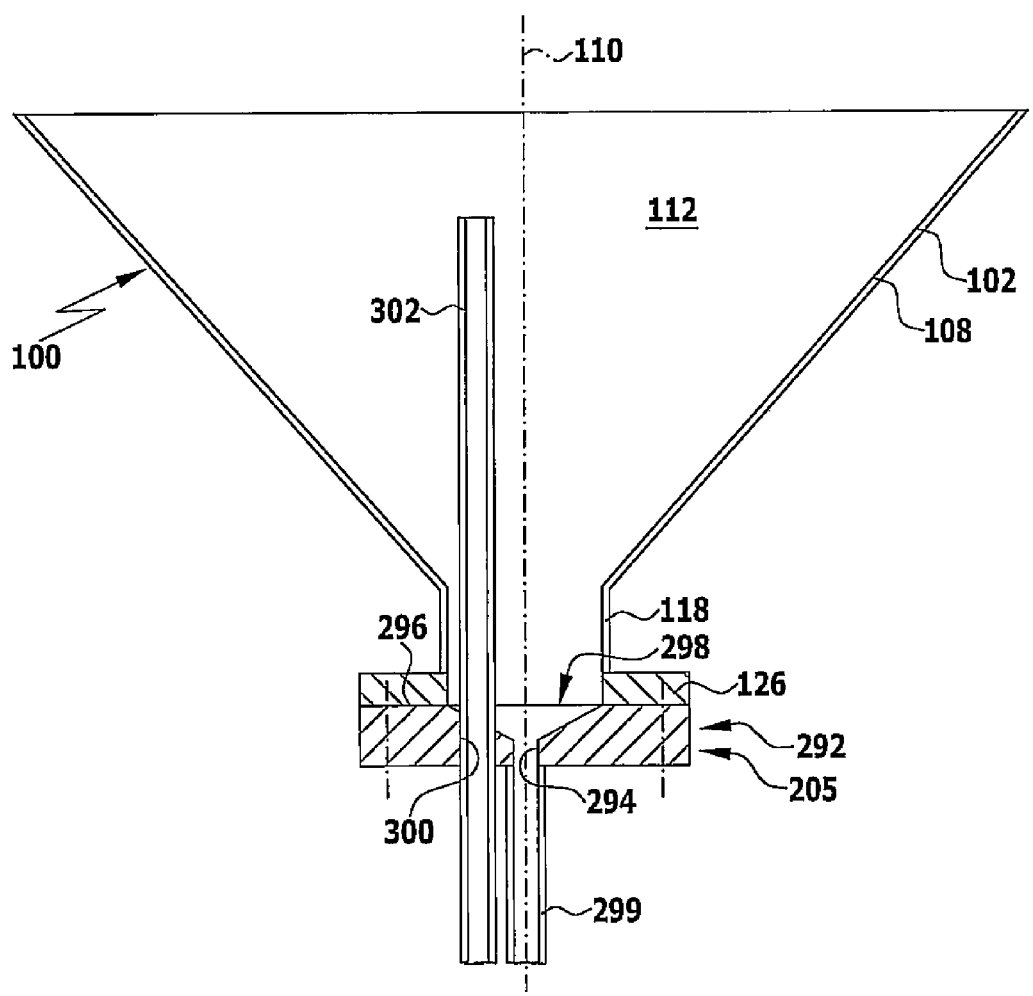
FIG. 11 shows an enlarged view of the region III from FIG. 10, which shows a twice used medium passage for feeding and removing a cleaning medium.

The feeding of the cleaning medium into the interior 112 of the process container 100 and the discharge of cleaning medium with floating dirt particles contained therein take place in the configuration of the process container 100 shown in FIG. 10 by means of the combined discharge and feed connection 292 shown in detail in FIG. 11, which is connected as the process element 205 to the exterior-side adapter 126 of the lower medium passage 118.

The discharge and feed connection 292 comprises a substantially central discharge bore 294, which widens in a funnel shape toward the upper side 296 of the discharge and feed connection 292, so the diameter of the mouth opening 298 of the discharge bore 294 on the upper side 296 of the discharge and feed connection 292 substantially corresponds to the internal diameter of the lower medium passage 118.

A discharge line 299 is connected in a fluid-tight manner to the end of the discharge bore 294 remote from the lower medium passage 118.

Furthermore, the discharge and feed connection 292 comprises a through-bore 300, into which a feed line 302 is inserted in fluid-tight manner.

The feed line 302 extends through the lower medium passage 118 into the interior 112 of the lower portion 108 of the container lower part 102 of the process container 100 and preferably runs substantially parallel to the centre axis 110 of the process container 100.

The feed line 302 may, in particular, run through the funnel-shaped portion of the feed bore 294.

The discharge line 299 is preferably dimensioned such that at most 70% of the cleaning medium fed through the feed line 302 into the interior 112 of the process container 100 discharges through the discharge line 299, while at least 30% of the fed cleaning medium gets over the upper edge 290 of the reflection screen 284 forming an overflow out of the interior 112 of the process container 100.

Figure 12:
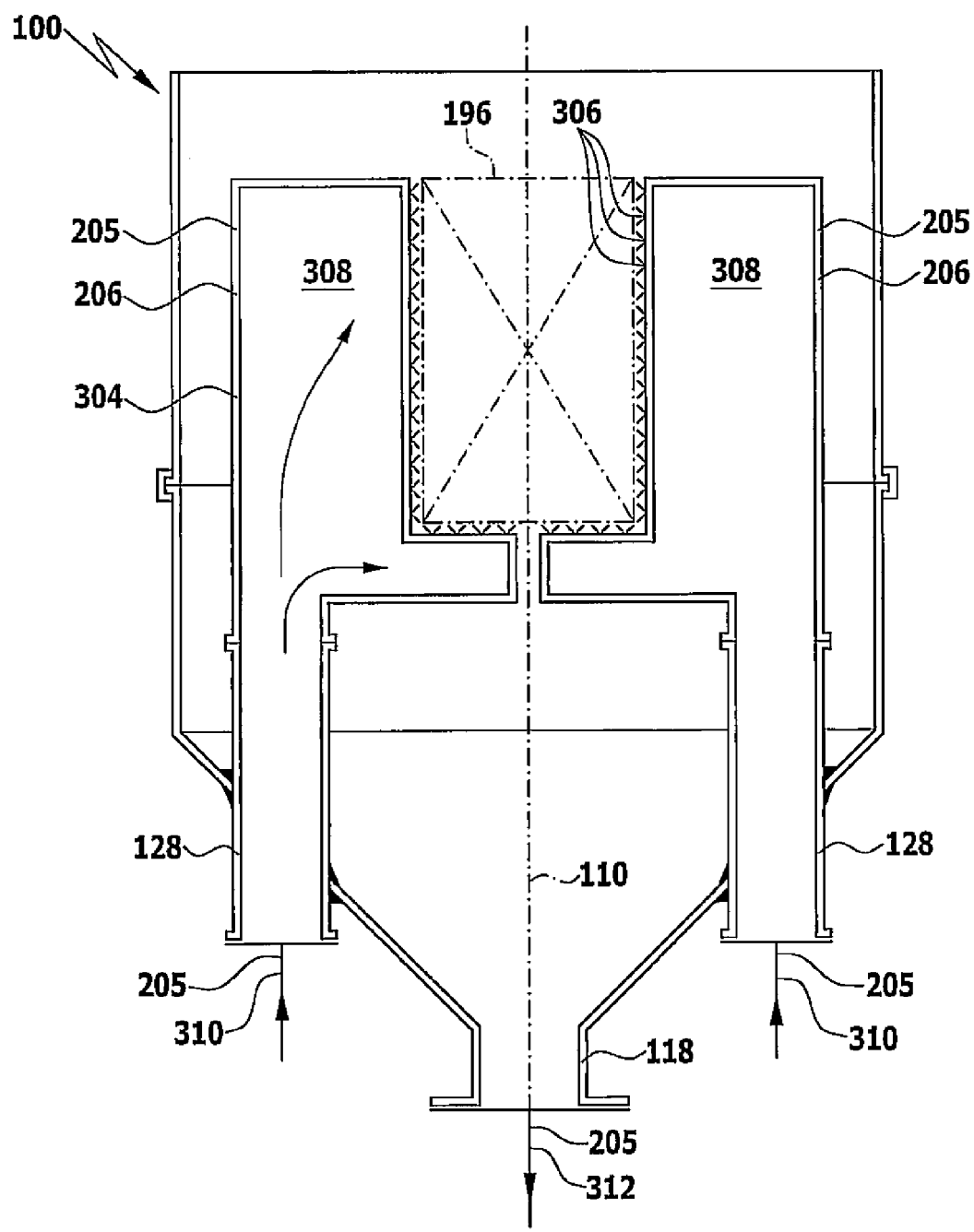
FIG. 12 shows a schematic section through a process container with treatment units arranged therein for carrying out a spray cleaning process.

An alternative configuration of the process container 100 shown in FIG. 12 serves to carry out a spray cleaning process on a workpiece 196.

A spray nozzle system 304 adapted to the outer contour of the workpiece 196 to be treated is in each case adapted, as the process element 205 and treatment unit 206, for this purpose, to at least two of the upper medium passages 128 of the process container 100.

Each of the spray nozzle systems 304 comprises a plurality of spray nozzles 306, by means of which a spray jet of a cleaning medium directed onto the workpiece 196 is producible in each case.

In connection therewith, at least one spray nozzle 306 may be arranged below the workpiece 196 in the washing position thereof, in order to generate a spray jet directed from below against the workpiece 196, and at least one spray nozzle can be arranged laterally next to the workpiece 196 in the washing position thereof, in order to generate a spray jet directed substantially horizontally from the side against the workpiece 196.

The spray nozzles 306 of the spray nozzle system 304 have a fluid connection to a cavity 308 in the interior of the spray nozzle system 304, through which the cleaning medium to be sprayed onto the workpiece 196 is flowable.

A cleaning medium feed line 310, as the process element 205, is in each case adapted on the exterior side to each of the upper medium passages 128, to which a spray nozzle system 304 is connected.

A cleaning medium discharge line 312, as the process element 205, is adapted to the lower medium passage 118 of the process container 100 in this configuration, on the exterior side.

The workpiece 196 to be treated by means of a spray cleaning process can be held during the treatment by the handling device 192 in the washing position in the interior 112 near the spray nozzle systems 304 or deposited on a workpiece placement area (not shown).

The cleaning medium is supplied to the spray nozzles 306 by means of the cleaning medium feed lines 310 and is discharged, once it has acted on the workpiece 196, together with the dirt detached from the workpiece 196 through the lower medium passage 118 and the cleaning medium discharge line 312 out of the interior 112 of the process container 100.

Figure 13:
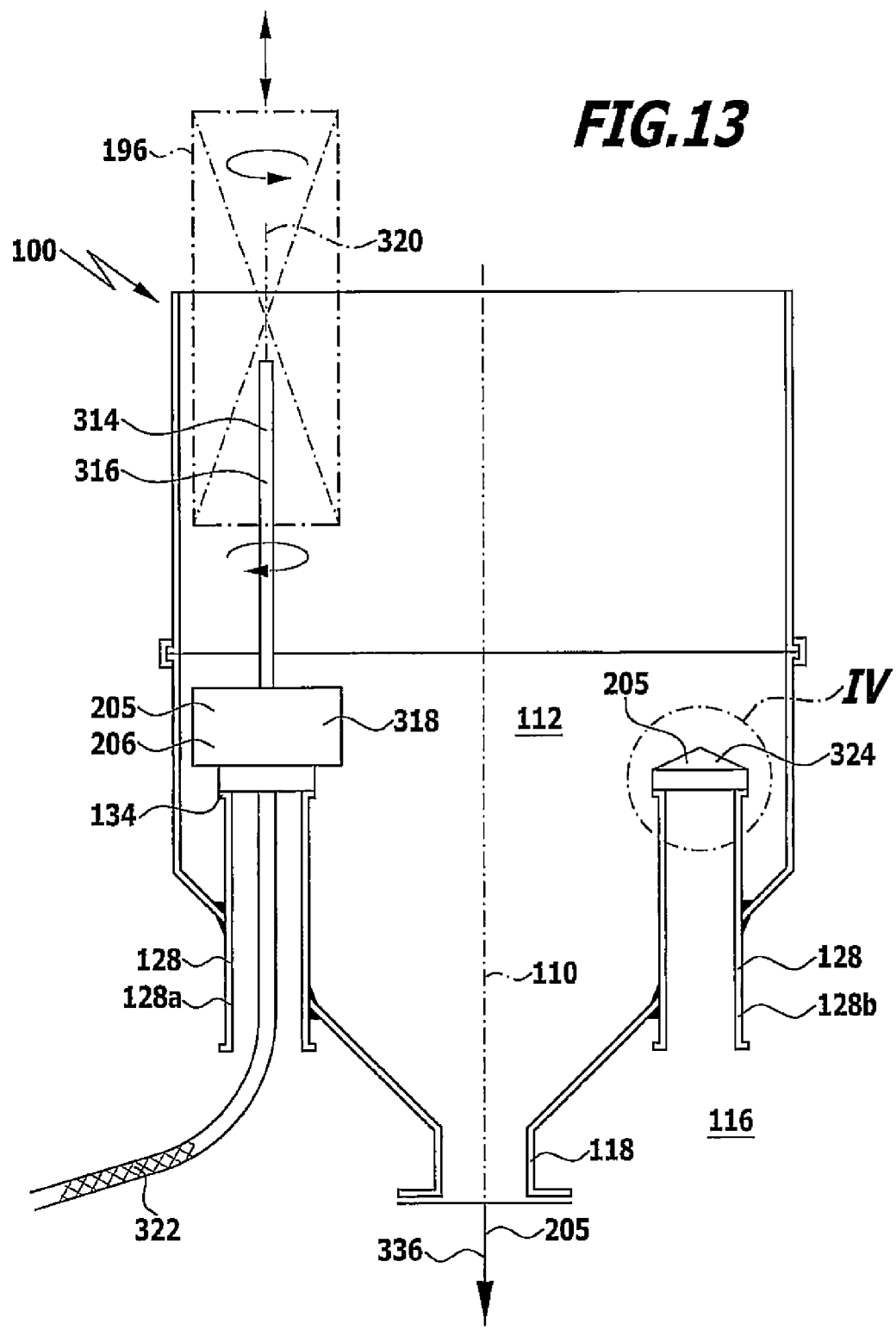
FIG. 13 shows a schematic section through a process container with treatment units arranged therein for carrying out a high pressure deburring process, at least one medium passage being connected on the interior side by means of a closure lid.

An alternative configuration of the process container 100 shown in FIG. 13 is used to carry out a high pressure deburring process on a workpiece 196.

For this purpose, one of the upper medium passages 128 of the process container 100, for example the first upper medium passage 128a, is provided on the interior side with a high pressure tool 314, as the process element 205 and treatment unit 206.

The high pressure tool 314 preferably comprises a nozzle lance 316, with which there is producible a high pressure medium jet directed onto burrs of the workpiece 196 to be deburred.

The nozzle lance 316 can be rotatably held by means of a rotation drive 318, in particular about the lance axis 320.

The rotary drive 318 is preferably connected by means of a suitable adapter to the interior-side adapter 134 of the first upper medium passage 128a.

A high pressure medium feed line 322, which feeds the high pressure medium from a high pressure medium source (not shown) to the high pressure tool 314, runs through the upper medium passage 128a in this configuration.

The high pressure medium is preferably under a pressure of at least 50 bar and preferably of at most 3000 bar.

The high pressure medium may, for example, be high pressure water.

The remaining upper medium passages 128b and 128c are connected on the interior side by means of a closure lid 324, as the process element 205, in this configuration of the process container 100, in order to prevent the medium used for the high pressure deburring arriving through the unused upper medium passages 128b and 128c into the exterior 116 of the process container 100.

Figure 14:
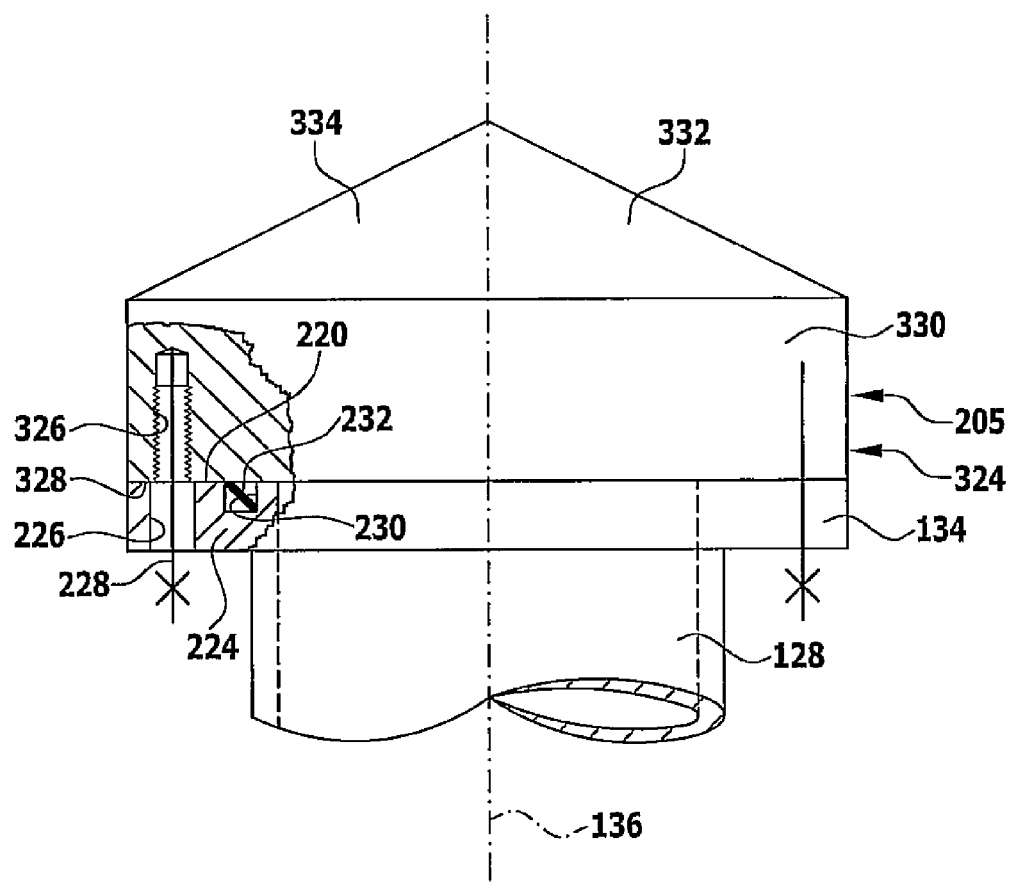
FIG. 14 shows an enlarged view of the region IV from FIG. 13, which shows an interior-side adapter of a medium passage and a closure lid connected thereto.

As can be seen in detail from FIG. 14, the closure lid 324, like a treatment unit 206, is connected to the interior-side adapter 134 of the particular upper medium passage 128.

For this purpose, the closure lid 324 is provided along its periphery with a plurality of, for example three, blind thread holes 326, which align with a respective through-bore 226 in the fastening portion 254 of the interior-side adapter 134 of the upper medium passage 128, so a suitable fastening means 228, in particular a fastening screw, can be introduced through the through-bore 226 into the thread bind hole 326 and can be screwed in there, in order to clamp the closure lid 324 and the interior-side adapter 134 against one another.

A seal between the closure lid 324 and the interior-side adapter 134 is achieved here by the annular sealing element 232, which is arranged in the annular groove 230 of the interior-side adapter 134 and is pressed against the lower side 328 of the closure lid 324.

The closure lid 324 may comprise a substantially cylindrical lower portion 330, in which the blind thread holes 326 are arranged, and a pyramidical or conical upper portion 332, which upwardly adjoins the lower portion 330 and of which the external face 334 that is inclined toward the horizontal ensures that neither a liquid media nor dirt particles can be deposited on the closure lid 324.

As the lower side 328 of the closure lid 324 abuts flat on the lower sealing face 220 of the interior-side adapter 134 of the upper medium passage 128, a dead space-free and gap-free seal is achieved between the closure lid 324 and the upper medium passage 128.

As the medium passages 128b and 128c not fitted with a high pressure tool 314 are closed by a respective closure lid 324, the medium used for the high pressure deburring of the workpiece 196 with the particles arranged therein, in particular deburring residues, only flows through the lower medium passage 118 and a medium discharge line 336 adapted thereto on the outside, as the process element 205, out of the interior 112 of the process container 100.

The workpiece 196 is brought by means of the handling apparatus 192 into the working region of the high pressure tool 314 and moved, in particular rotated and/or moved up and down, by means of the handling device 192 relative to the high pressure tool 314 during the high pressure deburring treatment.

In connection therewith, the interior 112 of the process container 100 may be substantially emptied or else partially or completely filled with a liquid medium, in particular with the medium used for the high pressure deburring.

Figure 15:
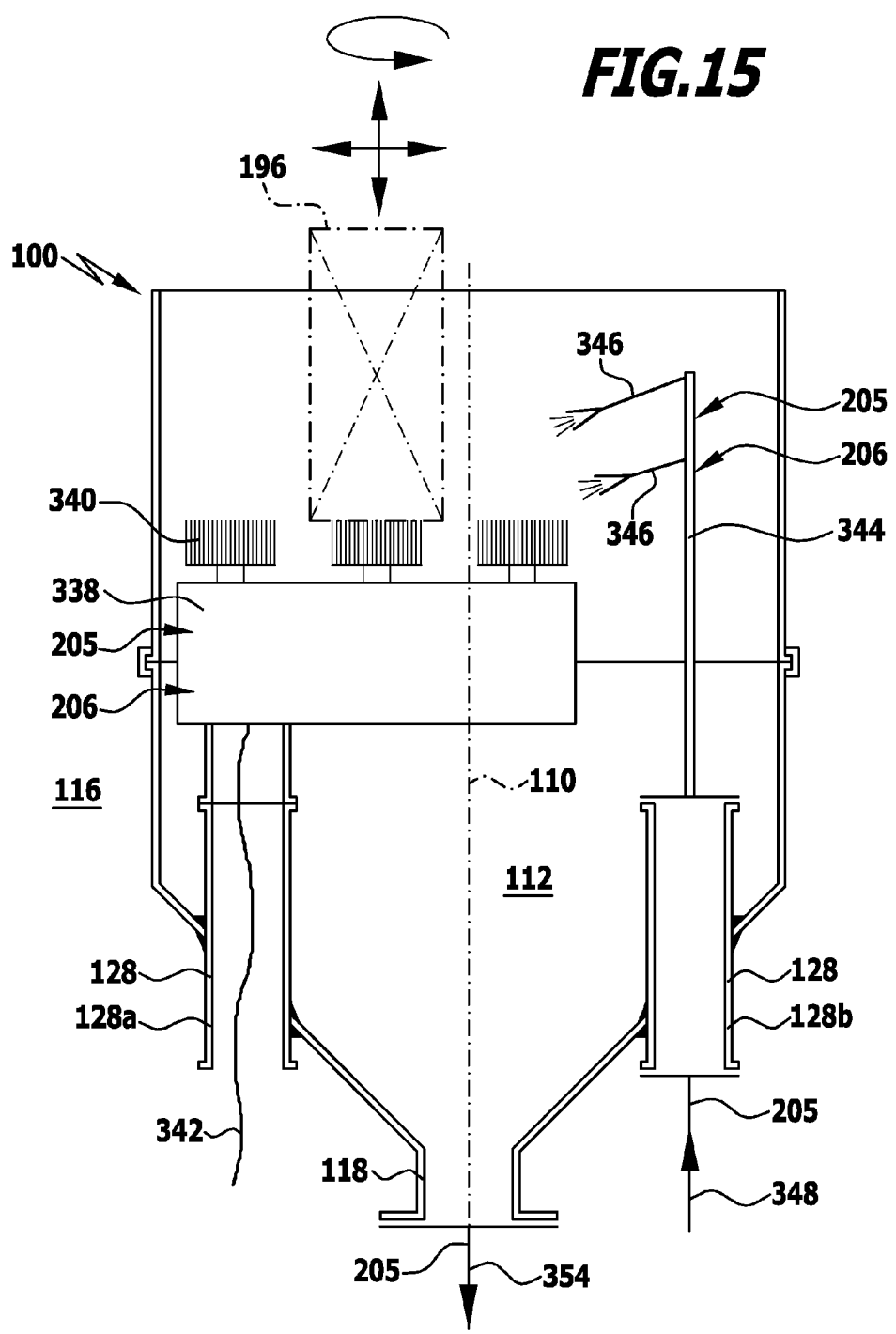
FIG. 15 shows a schematic section through a process container with treatment units arranged therein for carrying out a brush deburring process.

An alternative configuration of the process container 100 shown in FIG. 15 is used for carrying out a brush deburring on a workpiece 196.

For this purpose, a brush system 338, as the process element 205 and treatment unit 206, is adapted on the interior side to the first upper medium passage 128a.

The brush system 338 has a plurality of deburring brushes 340, which can be made to move by means of a movement device (not shown), in order to remove burrs on the workpiece 196 by brushing them off.

An energy feed 342 to this movement device, in the configuration shown in FIG. 15, runs through the first upper medium passage 128*a*. In this configuration, the energy to be fed to the movement device is therefore the medium, which is guided through the upper medium passage 128*a*.

A flushing system 344, as the process element 205 and treatment unit 206, is adapted to a second upper medium passage 128*b* on the interior side.

The flushing system 344 has one or more flushing nozzles 346, by means of which a flushing medium jet directed onto the workpiece 196 and/or onto a deburring brush 340 is producible in each case.

A flushing medium feed line 348 as the process element 205, is adapted on the exterior side to the second upper medium passage 128*b*.

A discharge line 354, by means of which abraded brushed material and flushing medium is dischargeable from the interior 112 of the process container 100, is connected to the lower medium passage 118 of the process container 100 on the exterior side in this configuration.

The workpiece 196 to be deburred, in order to carry out a brush deburring process, is brought by means of the handling apparatus 192 into the working region of the brush system 338 and moved relative to the deburring brushes 340 during the brush deburring process by means of the handling device 192, and, specifically, in particular rotated and/or moved toward or away from the deburring brushes 340 and/or moved in a longitudinal direction of the deburring brushes 340.

Figure 16:
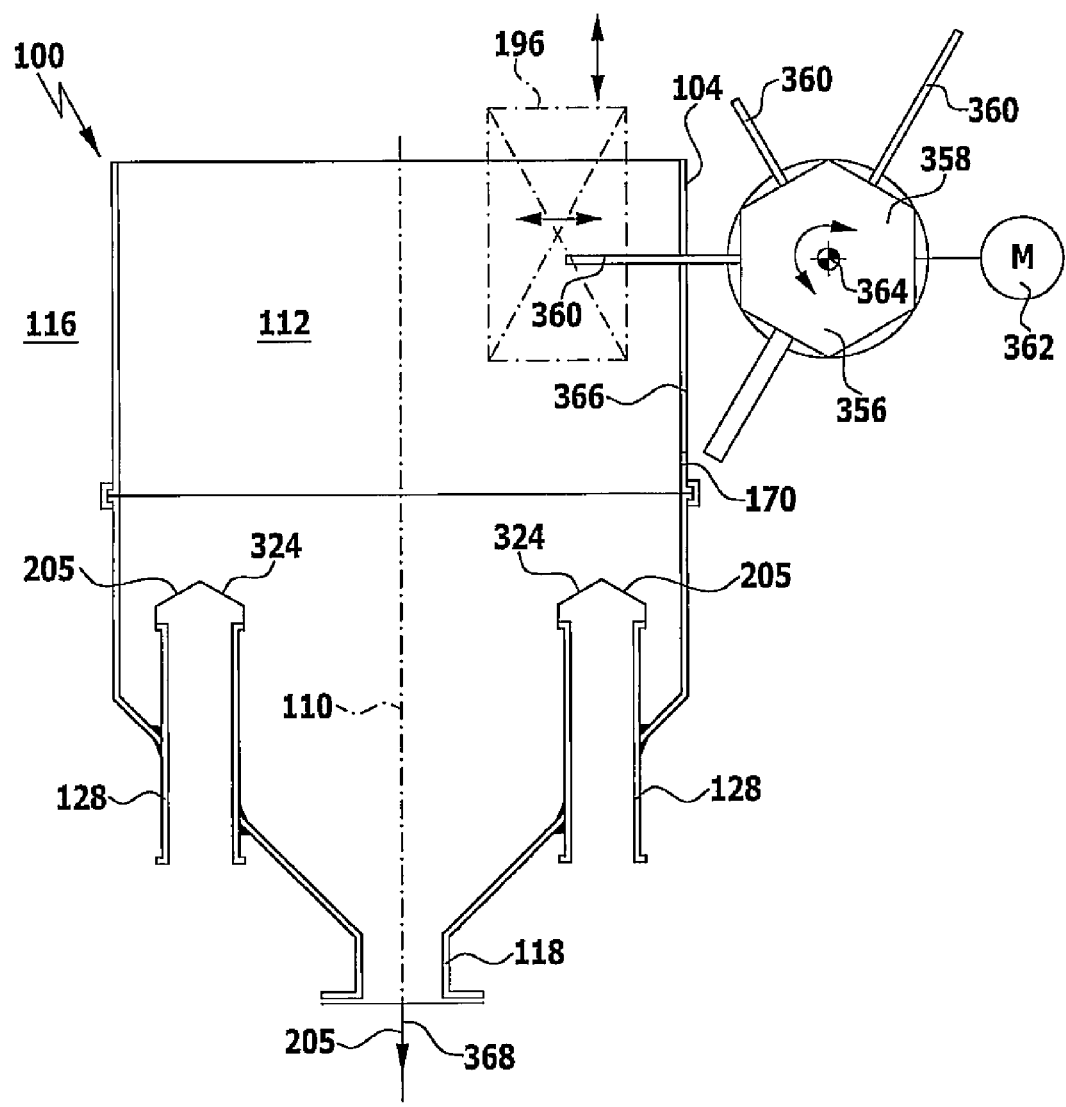
FIG. 16 shows a schematic section through a process container and a high pressure treatment unit with a plurality of high pressure tools, which is rotatable about a horizontal rotational axis and is selectively movable into a working position in the interior of the process container.

An alternative configuration of the process container 100 shown in FIG. 16, like the configuration shown in FIG. 13, serves to carry out a high pressure deburring process on a workpiece 196, a high pressure tool turret 356 with a base body 358, which carries a plurality of different high pressure tools 360, being provided in this case instead of a single high pressure tool.

The base body 358 is rotatable by means of a motor rotary drive 362 about a, for example, substantially horizontal rotational axis 364, so one of the high pressure tools 360 is, in each case, selectively pivotable into the interior 112 of the process container 100 through a gap 366 formed in the wall 170 of the container upper part 104 of the process container 100, in order to carry out a high pressure deburring treatment on a workpiece 196 arranged at least partly in the interior 112 of the process container 100.

A discharge line 368, through which the medium used for the high pressure deburring with the particles contained therein, in particular deburring residues, is dischargable from the interior 112 of the process container 100, is adapted to the lower medium passage 118 in this configuration of the process container 100, on the exterior side, as the process element 205.

The upper medium passages 128 are connected in this configuration by means of a respective closure lid 324 adapted, as the process element 205, to the upper medium passages 128 on the interior side.

The workpiece 196 to be deburred is brought by means of the handling apparatus 192 into the working region of the respective high pressure tool 360 introduced into the interior 112 of the process container 100 and moved relative to the high pressure tool 360 during the deburring process, in particular rotated and/or moved in the direction of the longitudinal axis of the high pressure tool 360 and/or moved up and down.

The same medium as in the configuration of FIG. 13 can be used as the high pressure medium in this configuration, in other words, for example water, which is under a pressure of preferably at least about 50 bar and preferably at most about 3000 bar.

Figure 17:
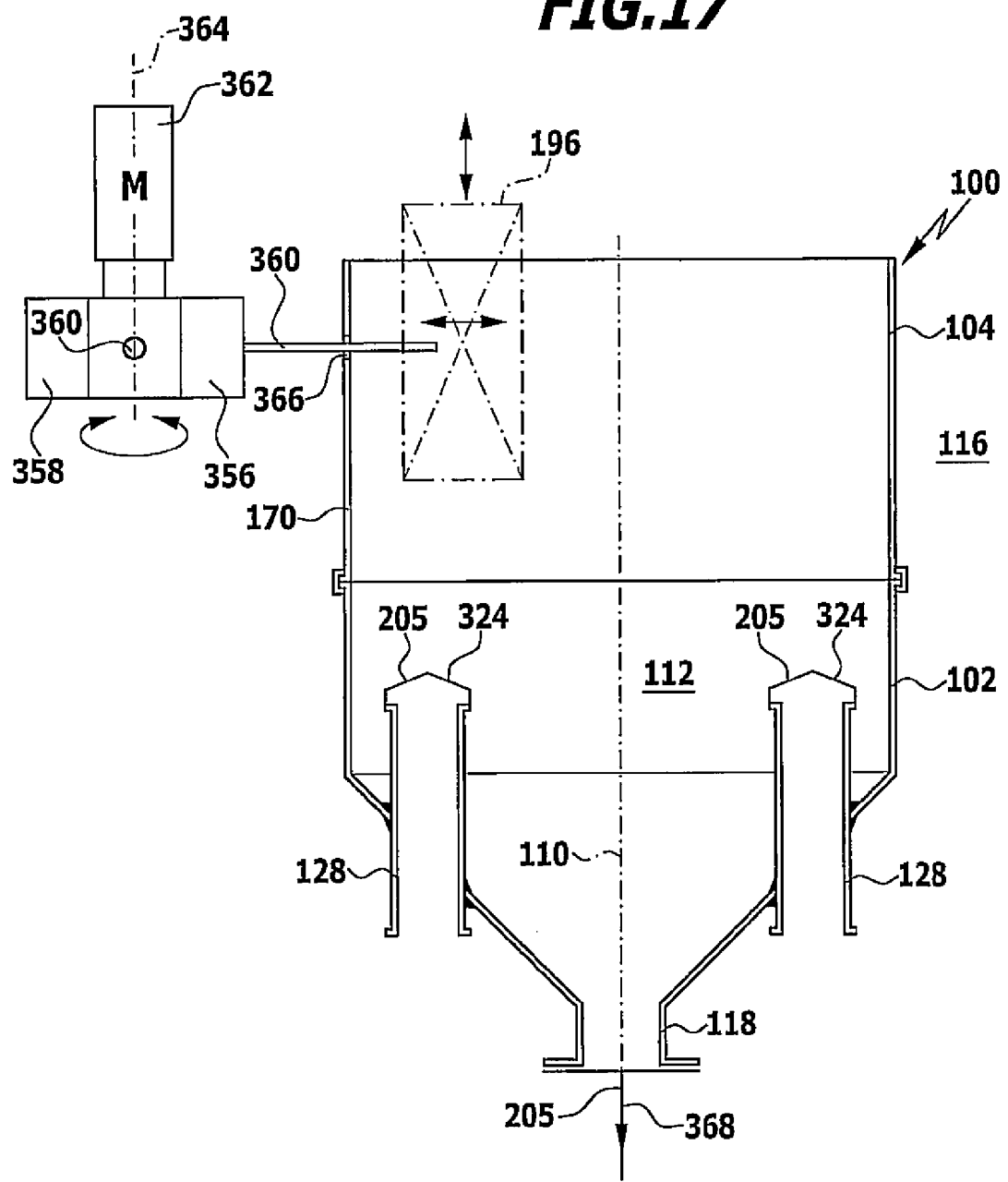
FIG. 17 shows a schematic section through a process container and a high pressure treatment unit with a plurality of high pressure tools, which is rotatable about a vertical rotational axis and is selectively movable into a working position in the interior of the process container.

A variant shown in FIG. 17 of the configuration of the process container 100 shown in FIG. 16 differs from the configuration shown in FIG. 16 only in that the rotational axis 364, about which the base body 358 of the high pressure tool revolver 356 is rotatable by means of the motor rotary drive 362, is not oriented substantially horizontally but is instead substantially vertically oriented.

Otherwise, the configuration of the process container 100 shown in FIG. 17 coincides with respect to structure and function with the configuration shown in FIG. 16 for high pressure deburring, to the above description of which reference is to this extent made.

Figure 18:
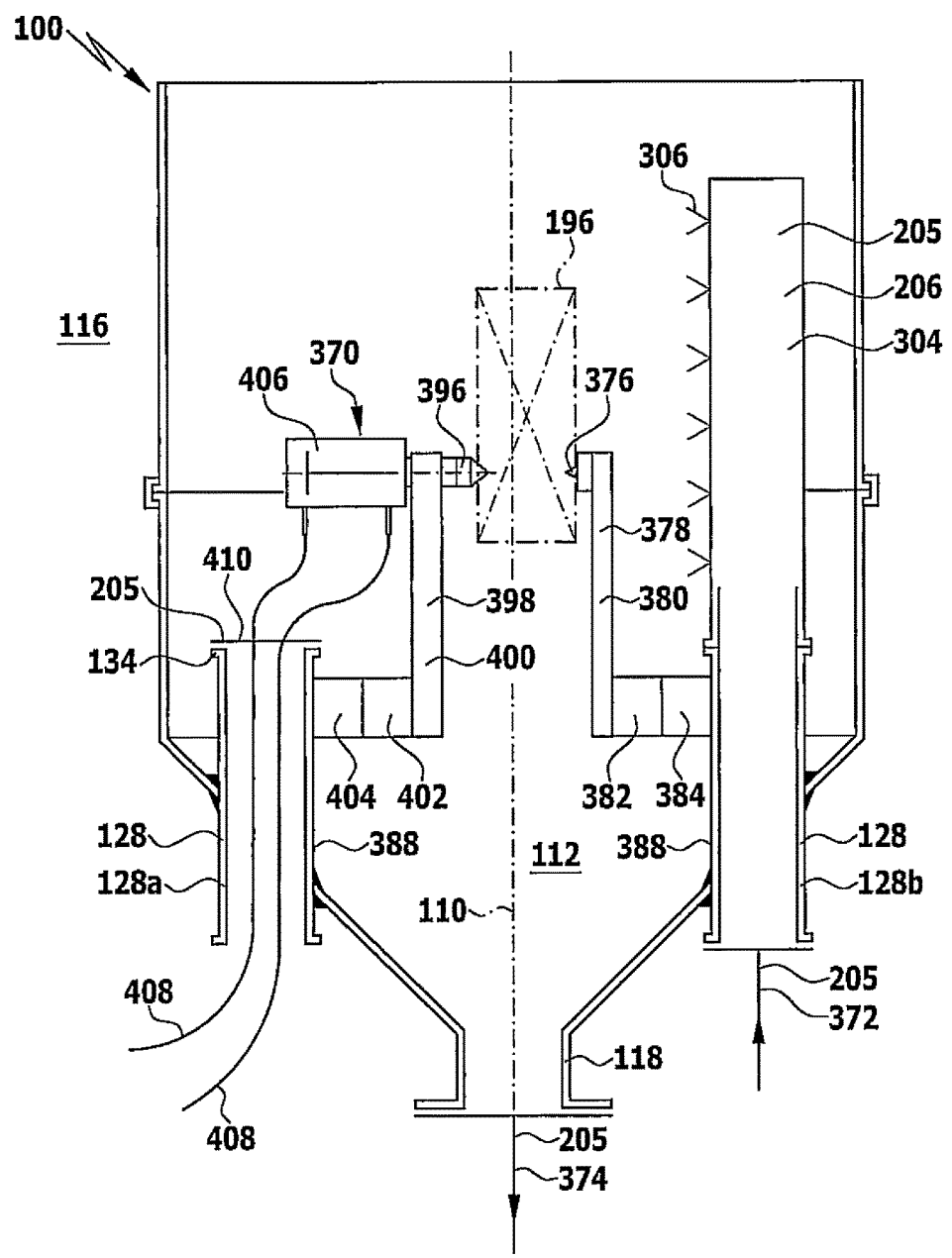
FIG. 18 shows a schematic section through a process container with treatment units arranged therein for carrying out a spray cleaning process and with a workpiece locking device held on mountings of medium passages.

An alternative configuration of the process container 100 shown in FIG. 18 serves to carry out a spray cleaning process of a workpiece 196, which is locked by means of a locking system 370 in a treatment position in the interior 112 of the process container 100.

A spray nozzle system 304 with a plurality of spray nozzles 306 is adapted for this purpose to the second upper medium passage 128*b*, as the process element 205 and treatment unit 206, on the interior side.

A process fluid feed line 372, by means of which a process fluid is feedable to the spray nozzles 306 of the spray nozzle system 304, from which process fluid the spray nozzle system 304 generates spray jets directed onto the workpiece 196, is adapted on the exterior side to the second upper medium passage 128*b*, as the process element 205.

A process fluid discharge line 374, by means of which process fluid, which has acted on the workpiece 196, together with dirt particles detached from the workpiece 196, is dischargable from the interior 112 of the process container 100, is adapted to the lower medium passage 118 in this configuration of the process container 100 on the exterior side, as the process element 205.

The locking system 370 for locking the workpiece 196 in a treatment position in the interior 112 of the process container 100 comprises a stationary clamping element 376, which is arranged on a holding angle bracket 380 with a vertical leg 378 and a horizontal leg 382.

Provided on the free end of the horizontal leg 382 of the holding angle bracket 378 is a mounting receiver 384, which is pushable onto a mounting 386, which projects from an outer peripheral wall 388 of the second upper medium passage 128*b* radially with respect to the longitudinal centre axis 136 of the upper medium passage 128*b* into the interior 112 of the process container 100. This mounting 386 is shown in detail in FIGS. 19 and 20.

The mounting 386 comprises a substantially cuboidal holding body 390, which is integrally connected, for example by welding, to the outer peripheral wall 388 of the upper medium passage 128 and tapers in a wedge shape at its upper end, so the mounting 386 is upwardly limited by two external faces 392 inclined with respect to the horizontal.

The slope of the external faces 392 relative to the horizontal means that neither liquids nor particles deposit on the external faces 392 when the mounting 386 is not used and is therefore freely accessibly arranged in the interior 112 of the process container 100.

Furthermore, the holding body 390 has one or more, preferably substantially horizontally oriented, through-bores 394, which align with respective associated through-bores in the mounting receiver 384 of the holding angle bracket 378 when the mounting receiver 384 is pushed onto the mounting 386.

Figure 20:
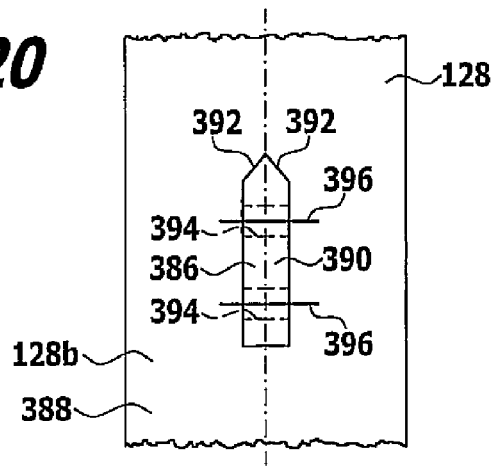
FIG. 20 shows a schematic front view of the mounting of the medium passage from FIG. 19, with the viewing direction in the direction of the arrow 20 in FIG. 19.

Suitable fastening means 396, which are shown only purely schematically with their longitudinal axes as broken lines in FIG. 20, can then be guided through the through-bores that align with one another in the mounting receiver 384 and in the holding body 390 and be locked with suitable locking means, for example fastening nuts, in their position on the mounting 386 and on the mounting receiver 384, so the mounting receiver 384 is fastened on the mounting 386.

Figure 19:
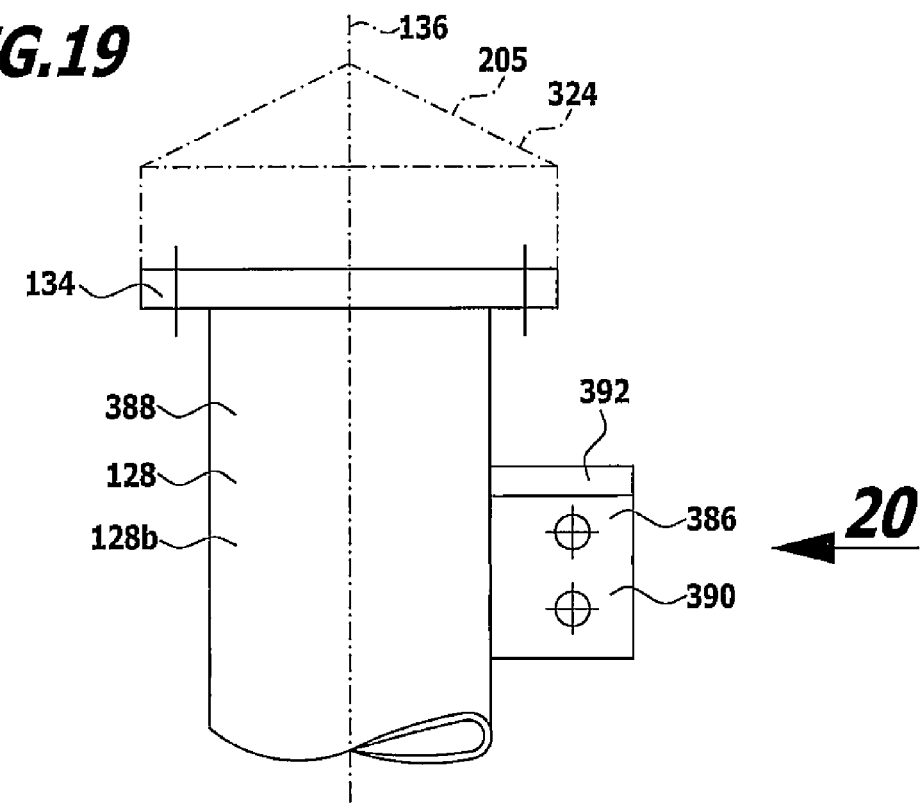
FIG. 19 shows a schematic side view of an interior-side end region of a medium passage with an interior-side adapter, to which a closure lid is connected, and with a mounting arranged on the outer periphery of the medium passage to hold a treatment unit and/or a workpiece receiver.

As shown schematically in FIG. 19, a closure lid 324, as the process element 205, may also be adapted to the upper medium passage 128 provided with the mounting 386, instead of a treatment unit 206.

Figure 3:
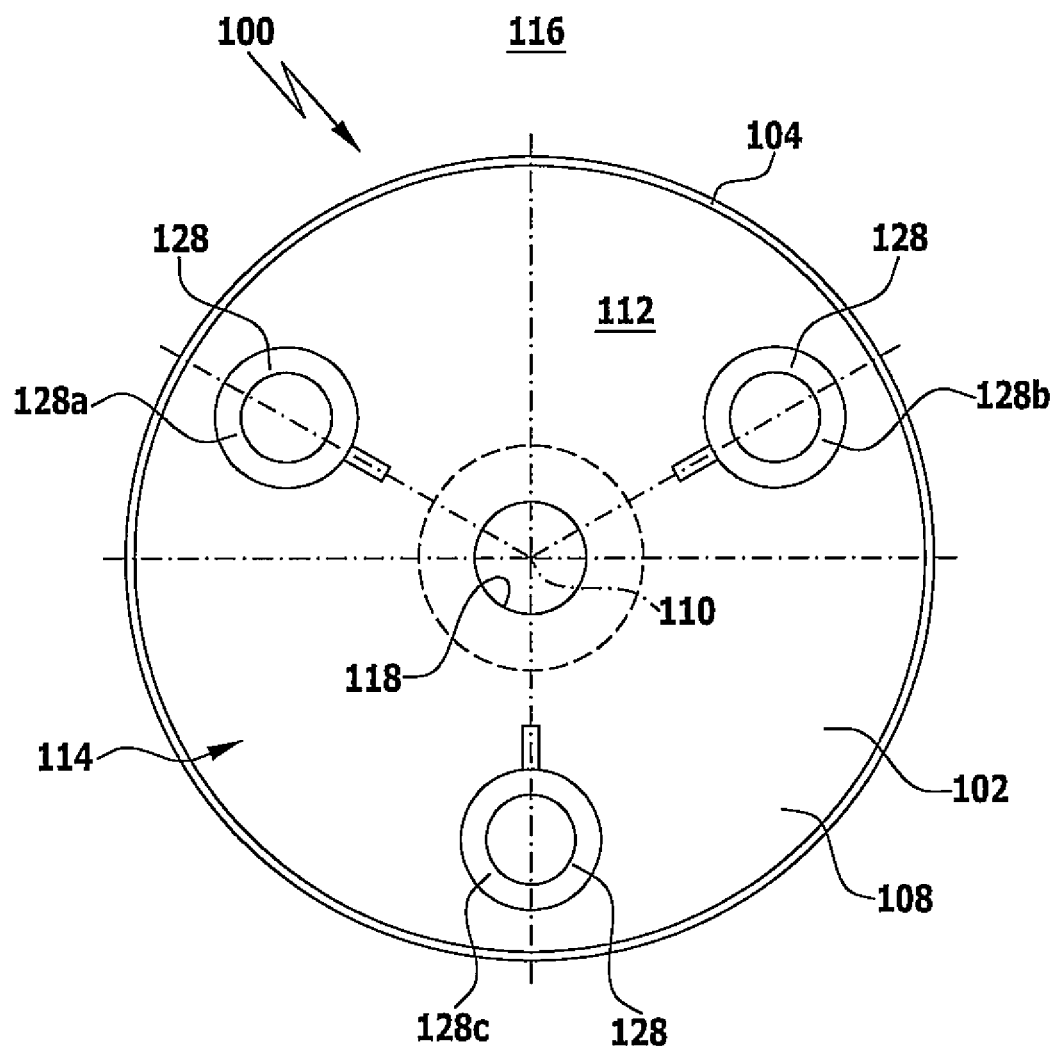
FIG. 3 shows a plan view from above of the process container from FIG. 1 with the viewing direction in the direction of the arrow 3 in FIG. 1.
Figure 4:
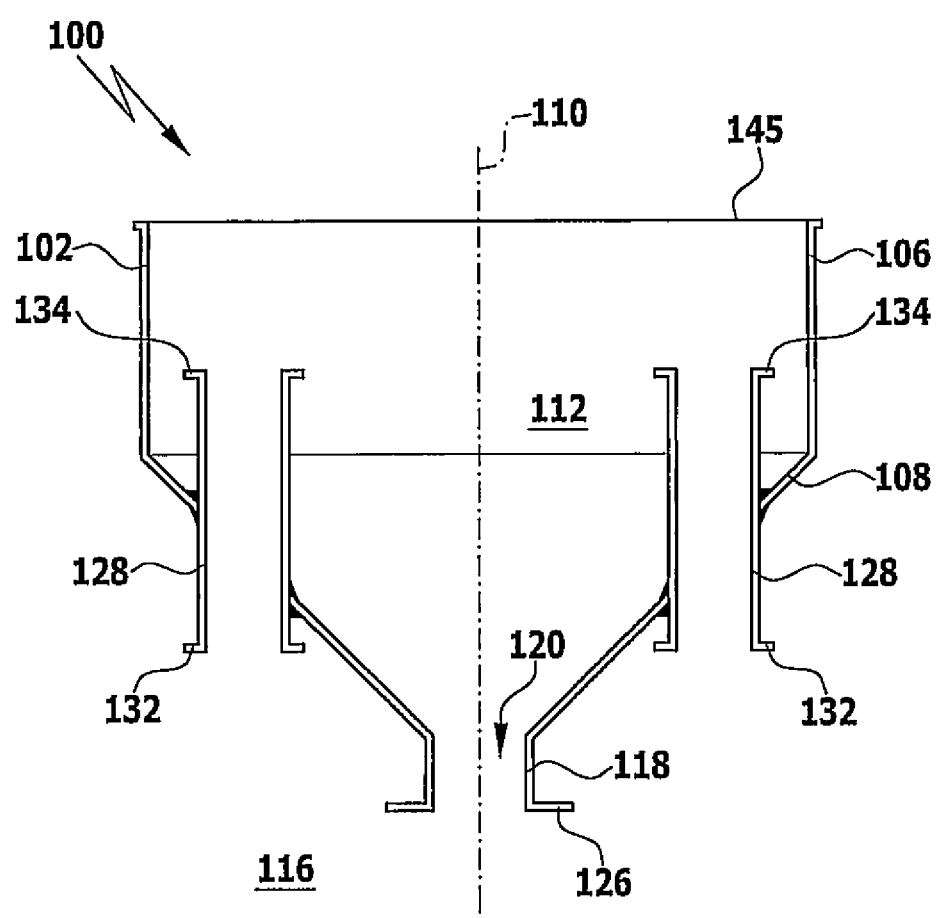
FIG. 4 shows a schematic vertical section through the process container, once a container upper part has been removed.

As can be seen, in particular from FIG. 3, the mountings 386 of the upper medium passages 128 are preferably oriented such that they are directed towards the centre axis 110 of the process container 100.

The locking system 370 furthermore has a movable clamping element 396, which is arranged on a further holding angle bracket 398 with a vertical leg 400 and a horizontal leg 402.

Arranged at the free end of the horizontal leg 402 of the further holding angle bracket 398 is a mounting receiver 404, which is also configured like the above-described mounting receiver 384 of the first holding angle bracket 378 and cooperates with a mounting 386 on the outer peripheral wall 388 of the first upper medium passage 128*a* in such a way that the further holding angle bracket 398 is held by means of the mounting 386 on the first upper medium passage 128*a*.

The further holding angle bracket 398 furthermore carries a drive device 406, by means of which the movable clamping element 396 is movable from a clamping position shown in FIG. 18 relative to the stationary clamping element 376 and the workpiece 196 into a release position (not shown) and from the release position into the clamping position.

Electrical energy is suppliable to the drive device 406 by means of two energy feed lines 408, which are guided through the interior of the first upper medium passage 128*a*.

The energy feed lines 408 run through a guide plate 410, which, as the process element 205, is adapted to the interior-side adapter 134 of the first upper medium passage 128*a*.

The workpiece 196 to be treated is brought by means of the handling apparatus 192 into the treatment position in the interior 112 of the process container 100 and arranged, in particular, between the stationary clamping element 376 and the movable clamping element 396 located in the release position.

The drive device 406 is thereupon actuated by a control device (not shown) of the treatment device, which comprises the process container 100, in order to move the movable clamping element 396 from the release position into the clamping position, in which the workpiece 196 to be treated is clamped between the movable clamping element 396 and the stationary clamping element 376 and is thereby locked, preferably positively, in the treatment position.

Instead of being actuated by a control device of the treatment device, the drive device 406 can also be actuated by the handling apparatus 192, once the handling apparatus 192 has deposited the workpiece 196 in the treatment position.

In this case, the drive device 406 preferably has an actuating element (not shown), which is actuable by the handling apparatus 192, for example a pushbutton switch or a proximity sensor, which reacts to the presence of the handling apparatus 192.

Figure 21:
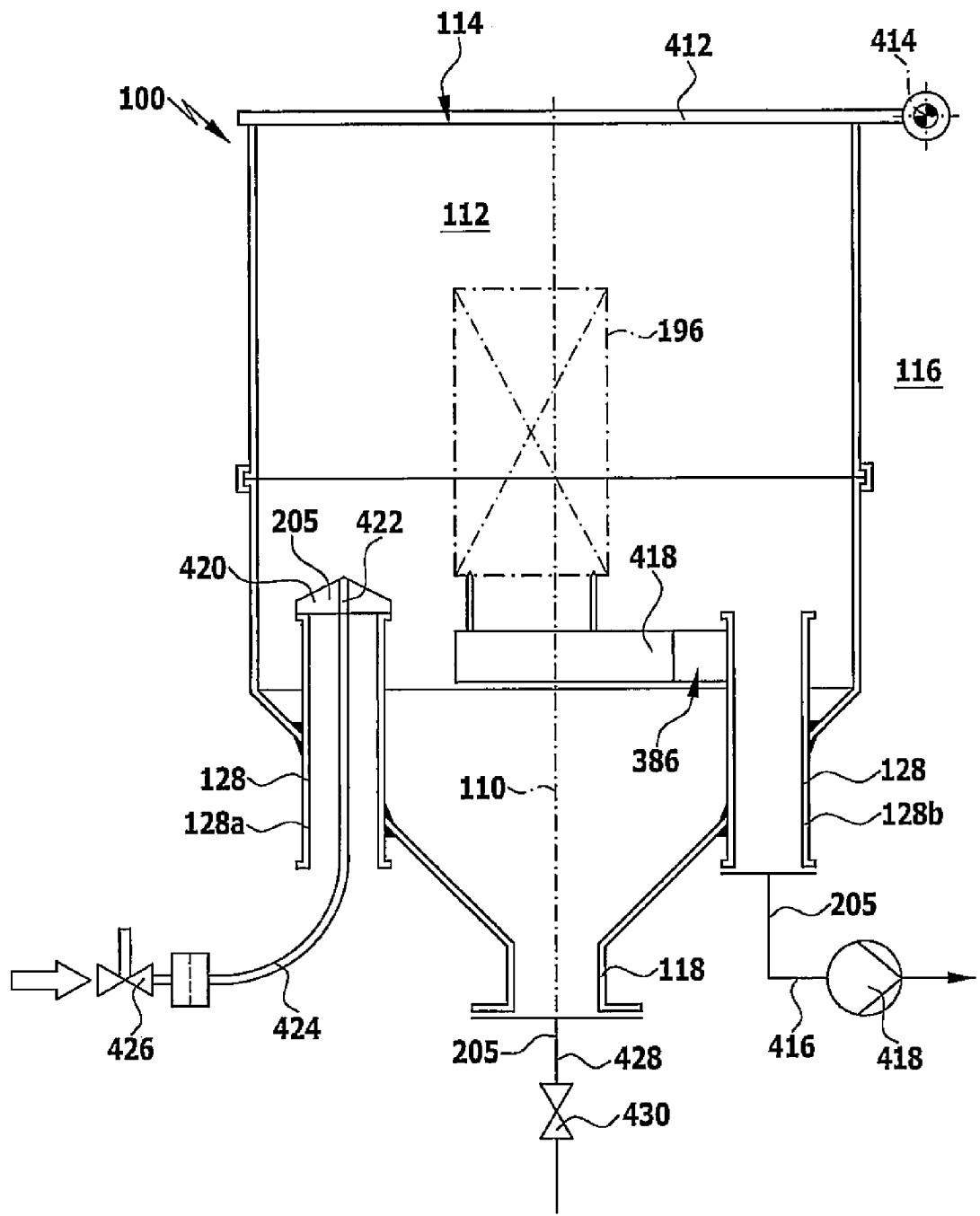
FIG. 21 shows a schematic section through a process container with a vacuum-tight lid for carrying out a vacuum drying process.

An alternative configuration of the process container 100 shown in FIG. 21 serves to carry out a vacuum drying process on a workpiece 196.

In order to be able to close the interior 112 of the process container 100 in a fluid-tight manner for this purpose, the process container 100 in this configuration is provided with a vacuum-tight lid 412, by means of which the upper access opening 114 of the process container 100 is closable.

In order to be able to introduce the workpiece 196 by means of the handling apparatus 192 through the access opening 114 into the interior 112 of the process container 100, the lid 412 is pivotably mounted about a, preferably substantially horizontal, pivot axis 414.

In order to be able to evacuate the interior 112 of the process container 100, a suction line 416 of a vacuum pump 418 is adapted, as the process element 205, to the second upper medium passage 128*b* in this configuration of the process container 100, on the exterior side.

A workpiece receiver 418, in particular in the form of a workpiece support, is held on the mounting 386 of the second upper medium passage 128*b* in the interior 112 of the process container 100.

The workpiece 196, which is to be vacuum dried, can be introduced by means of the handling apparatus 192 into the interior 112 of the process container 100 and deposited on the workpiece receiver 418.

A ventilation unit 420 is adapted to the first upper medium passage 128*a* in this configuration on the interior side, as the process element 205 and treatment unit 206.

The ventilation unit 420 is similarly constructed to a closure lid 324 to close the interior of the upper medium passage 128 relative to the interior 112 of the process container 100, but is provided with a ventilation channel 422, which passes through the ventilation unit 420 and is connected to a ventilation line 424, which extends through the interior of the first upper medium passage 128*a* and leads to a ventilation valve 426.

By opening the ventilation valve 426, the interior 112 of the process container 100 can be ventilated, for example with ambient air, before the lid 412 is opened in order to remove the workpiece 196 on conclusion of the vacuum drying process from the interior 112 of the process container 100.

A condensate outlet line 428 with a condensate outlet valve 430 arranged therein is adapted to the lower medium passage 118 in this configuration on the exterior side, as the process element 205.

By opening the condensate outlet valve 430, condensate, which has collected at the base of the interior 112 of the process container 100, can be discharged from the interior 112, when the interior 112 has been ventilated by means of the ventilation line 424.

Figure 22:
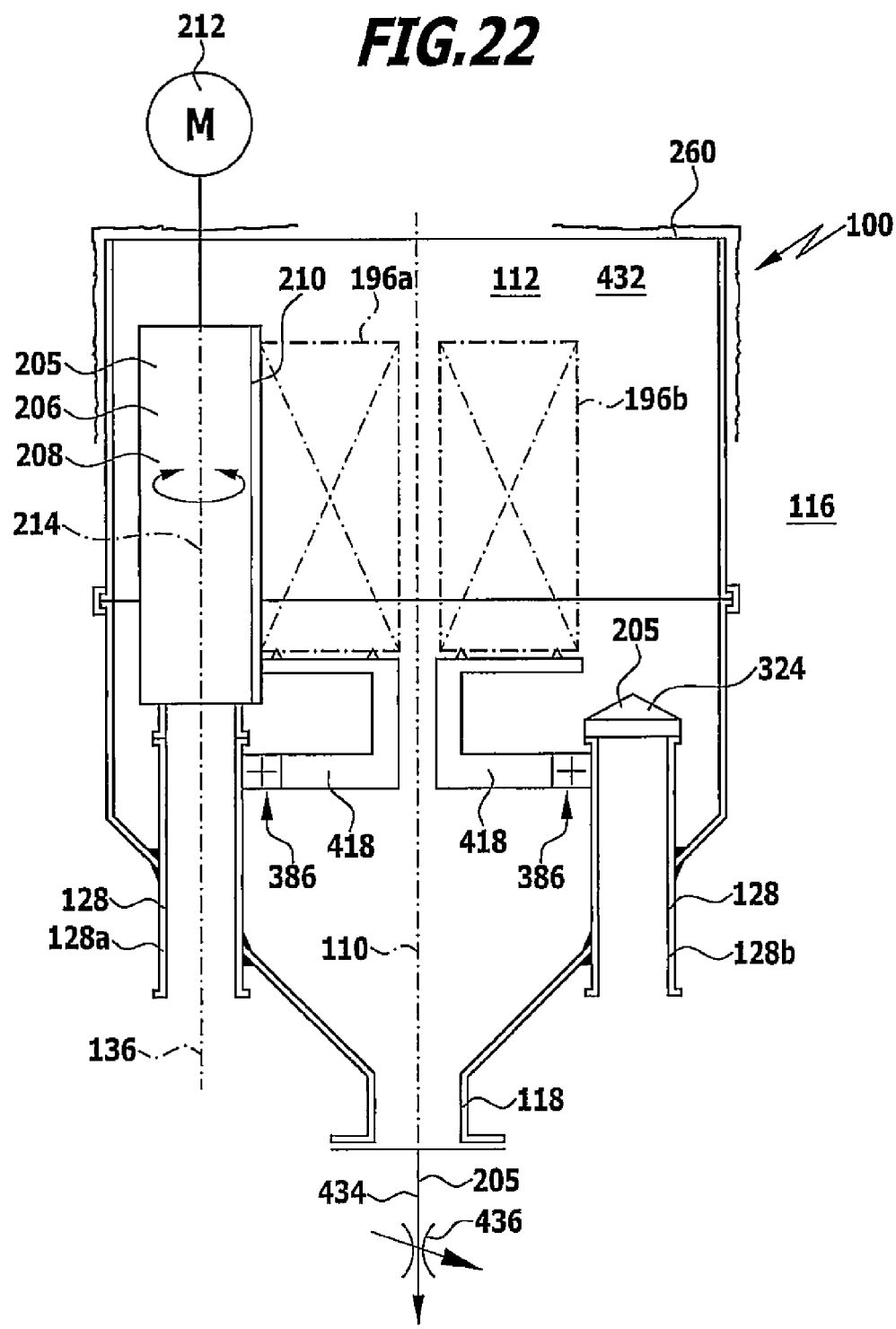
FIG. 22 shows a schematic section through a process container with a plurality of workpiece receivers arranged in the interior of the process container for simultaneous treatment of a plurality of workpieces and with a treatment unit for carrying out an injection flood washing process.

An alternative configuration of the process container 100 shown in FIG. 22 serves to simultaneously carry out an injection flood washing process on a plurality of workpieces 196, which are simultaneously arranged in the interior 112 of the process container 100.

For this purpose, as in the configuration of the process container 100 shown in FIG. 7, a movable nozzle system 208, which has a slit nozzle 210 serving to generate a cleaning medium jet, is adapted to the first upper medium passage 128*a* on the interior side, as the process element 205 and treatment unit 206.

The slit nozzle 210 is rotatable by means of a motor rotary drive 212 about a, preferably vertically oriented, rotary axis 214, which may coincide with the longitudinal centre axis 136 of the upper medium passage 128.

Held on the mounting 386 of the first upper medium passage 128a is a workpiece receiver 418, on which the first workpiece 196a is placeable by the handling apparatus 192 for a cleaning process.

Held on the mounting 386 of the second upper medium passage 128b is a further workpiece receiver 418, on which a second workpiece 196b to be treated is placeable by the handling apparatus 192.

The interior 112 of the process container 100 is filled with the cleaning medium bath 432 up to the upper edge 260 thereof.

The upper edge 260 of the process container 100 serves as an overflow, over which excess cleaning medium (together with light dirt particles and optionally oils, which have a lower density than the cleaning medium) discharges from the interior 112 of the process container 100, when additional cleaning medium is fed into the interior 112 of the process container by means of the slit nozzle 210.

By rotating the slit nozzle 210 about the rotary axis 214, the two workpieces 196a and 196b can be alternately acted upon by a jet of the cleaning medium within the cleaning medium bath 432.

It is also conceivable to swap the treatment positions of the two workpieces 196a and 196b after a certain cleaning time by means of the handling apparatus 192 or to remove one of the workpieces 196a and 196b completely from interior 112 and to bring the respective other workpiece 196b or 196a by means of the handling device 192 to the treatment position of the workpiece 196a or 196b removed from the interior 112.

The second upper medium passage 128b and optionally also the third upper medium passage 128c (not shown in FIG. 22) are preferably closed in this configuration by means of a closure lid 324, as the process element 205.

A cleaning medium discharge line 434, which is adapted on the exterior side, as the process element 205, to the lower medium passage 118 and is closable by means of a check valve 436, serves to empty the process container 100.

Figure 23:
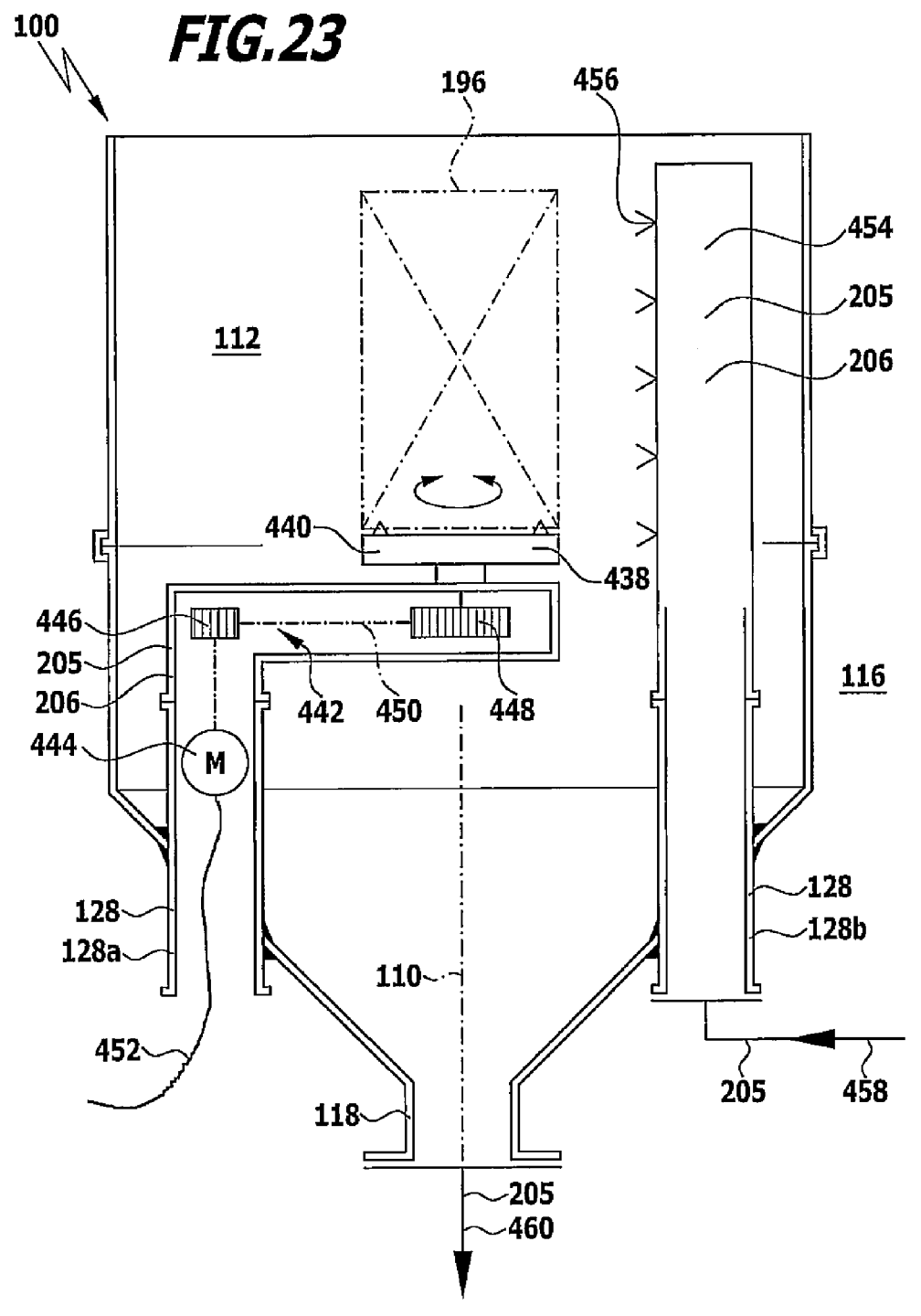

An alternative configuration of the process container 100 shown in FIG. 23 serves to carry out a spray cleaning process on a workpiece 196, which is rotated by means of a rotary mechanism 438 during the spraying process.

The workpiece rotary mechanism 438 is adapted for this purpose to the first upper medium passage 128a on the interior side, as a process element 205 and treatment unit 206.

The workpiece rotary mechanism 438 comprises a rotatable workpiece receiver 440, on which the workpiece 196 is placeable by means of the handling apparatus 196, and a rotary drive device 442, which may comprise a drive motor 444 to drive a first pinion 446, a second pinion 448 non-rotatably connected to the rotatable workpiece receiver 440 and a coupling belt 450 to couple the first pinion 446 and the second pinion 448.

The feeding of energy to the drive motor 444 takes place by means of an energy feed line 452, which extends through the interior of the first upper medium passage 128a.

A spray nozzle system 454 is adapted to the second upper medium passage 128b in this configuration of the process container 100 on the interior side, as the process element 205 and treatment unit 206.

The spray nozzle system 454 has a plurality of spray nozzles 456, by means of which a spray jet of a liquid cleaning medium directed toward the workpiece 196 is producible in each case.

The spray nozzles 456 are arranged consecutively in a longitudinal direction of the spray nozzle system 454.

On the exterior side, the second upper medium passage 128b is connected to a cleaning medium feed line 458, as the process element 205.

The third upper medium passage 128c (not shown in FIG. 23) may also be provided with a spray nozzle system 454 in this configuration or be closed by means of a closure lid 324.

A cleaning agent discharge line 460 is adapted to the lower medium passage 118 in this configuration of the process container 100 on the exterior side, as the process element 205.

The workpiece rotary mechanism 438 may also be combined with other treatment units 206, for example to carry out an injection flood washing process, a blowing process, an ultrasonic cleaning process or a deburring process.

Figure 24:
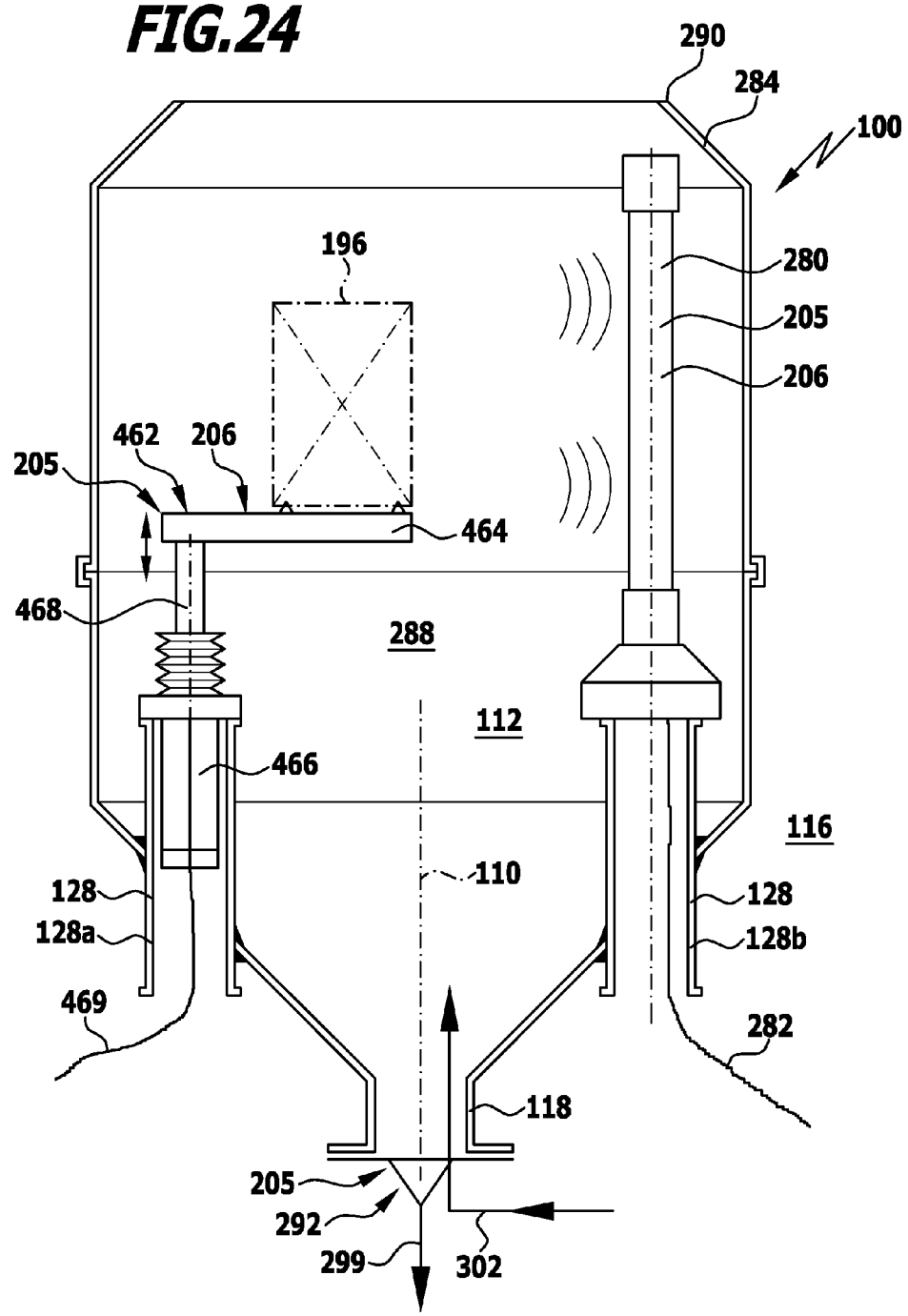
FIG. 24 shows a schematic section through a process container with a workpiece lifting mechanism arranged therein and a treatment unit for carrying out an ultrasonic cleaning process.

An alternative configuration of the process container 100 shown in FIG. 24 serves to carry out an ultrasonic cleaning process on a workpiece 196, which is movable relative to an ultrasonic oscillator 280 by means of a workpiece lifting mechanism 462 in the interior 112 of the process container 100.

The workpiece lifting mechanism 462 is adapted for this purpose to the first upper medium passage 128a on the interior side, as the process element 205 and treatment unit 206.

The workpiece lifting mechanism 462 comprises a movable workpiece receiver 462, on which the workpiece 196 can be placed by means of the handling apparatus 192.

Furthermore, the workpiece lifting mechanism 462 comprises a movement mechanism 466, by means of which a lifting rod 468, which carries the workpiece receiver 464, can be moved up and down in the vertical longitudinal direction of the lifting rod 468.

As also in the configuration of the process container 100 shown in FIGS. 10 and 11, the interior 112 of the process container 100 is filled to the upper edge 290 of a reflection screen 284 placed on the container upper part 104 with a cleaning medium bath 288, which serves to transmit ultrasonic waves from the ultrasonic oscillator 280 to the workpiece 196.

The ultrasonic oscillator 280 is adapted, as the process element 205 and treatment unit 206, on the interior side to the second upper medium passage 128b.

An energy feed line 282 of the ultrasonic oscillator 280 extends through the interior of the second upper medium passage 128b into the exterior 116 of the process container 100.

An energy feed line 469, which serves to feed the required electrical energy to the movement mechanism 466 of the workpiece lifting mechanism 462, extends through the interior of the first upper medium passage 128a into the exterior 116 of the process container 100.

A combined discharge and feed connection 292 is adapted to the lower medium passage 118 in this configuration of the process container 100, as also in the configuration shown in FIGS. 10 and 11, in order to feed cleaning medium into the interior 112 of the process container 100 and to be able to discharge excess cleaning medium and dirt particles out of the interior 112 of the process container 100.

In the configuration of the process container 100 shown in FIG. 24, the workpiece 196 deposited on the workpiece lifting mechanism 462 can be linearly moved by means of the workpiece lifting mechanism 462 relative to the ultrasonic oscillator 280 during the ultrasonic cleaning process, in particular be moved up and down, in order to consecutively act on different points of the surface of the workpiece 196 with ultrasound of different intensity.

Figure 25:
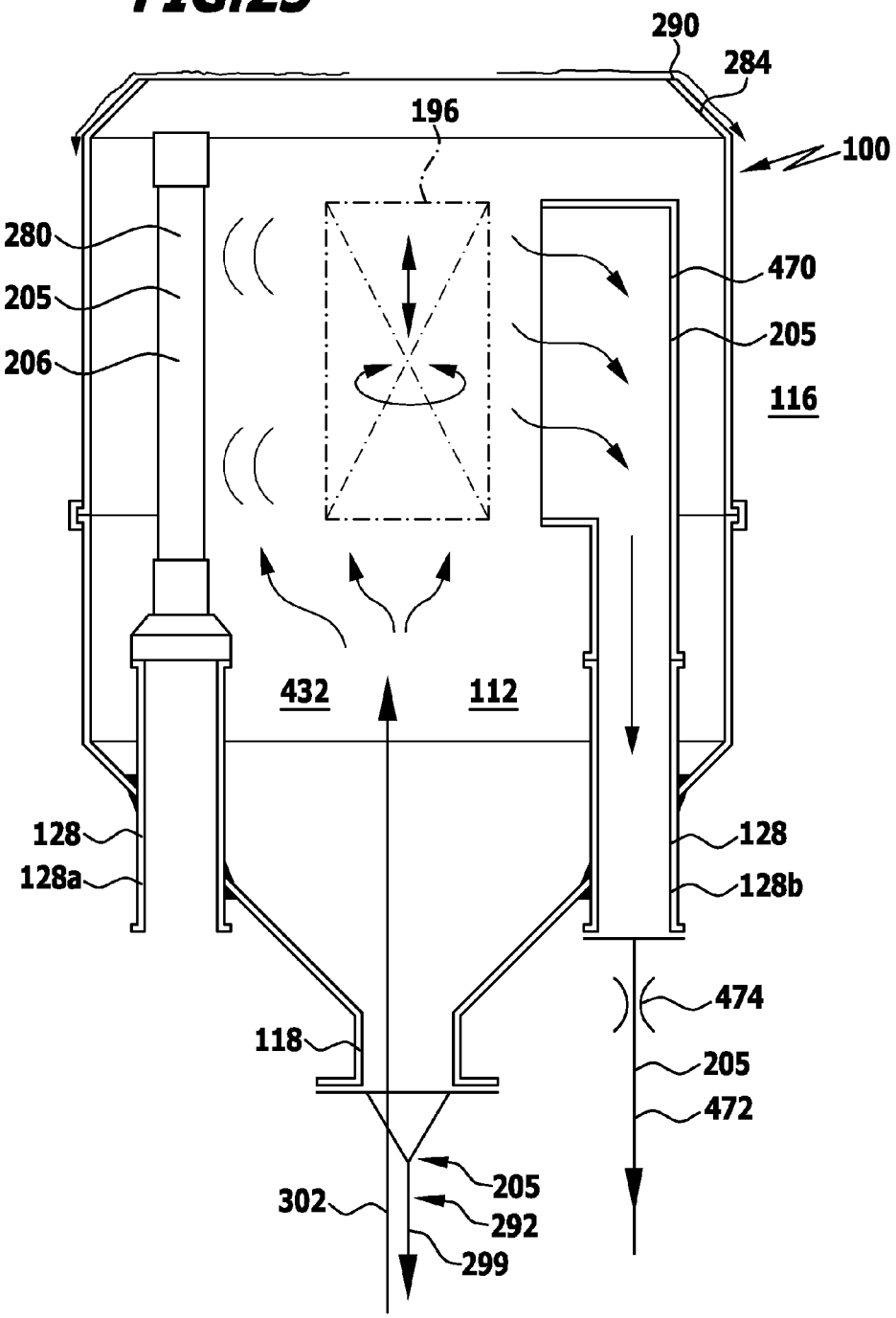
FIG. 25 shows a schematic section through a process container with treatment units for carrying out an ultrasonic cleaning process with targeted suction of contamination from a cleaning bath.

An alternative configuration of the process container 100 shown in FIG. 25 serves to carry out an ultrasonic cleaning process on a workpiece 196, which is arranged in the interior 112 of the process container 100, contamination detached from the workpiece 196 by the ultrasonic cleaning process being extracted by suction in a targeted manner.

For this purpose, an ultrasonic oscillator 280 is adapted to the first upper medium passage 128a, as the process element 205 and treatment unit 206, on the interior side.

A suction hood 470 is adapted to the second upper medium passage 128b on the interior side, as the process element 205 and treatment unit 206, and a suction line 472 is adapted on the exterior side as the process element 205.

As shown in FIG. 25, a Venturi nozzle 474 or a discharge nozzle may be arranged in the discharge line 472.

As an alternative or in addition to this, a suction pump may be arranged in the discharge line 472.

Furthermore, it is possible for the discharge line 472 to form a free outlet, in which the liquid entering the suction hood 470 flows downward out of the interior 112 of the process container 100 purely because of the effect of gravitational force.

A combined discharge and feed connection 292 is adapted to the lower medium passage 118 in this configuration, just as in the configurations from FIGS. 10 and 24.

A reflection screen 284, the upper edge 290 of which forms an overflow, over which excess cleaning medium can discharge from the interior 112 of the process container 100, is placed on the container upper part 104 of the process container 100.

In the configuration of the process container 100 shown in FIG. 25, contamination detached from the workpiece 196 by means of the ultrasound generated by the ultrasonic oscillator 280 is extracted by suction from the interior 112 of the process container 100 by the suction hood 470, which is preferably arranged on the side of the workpiece 196 remote from the ultrasonic oscillator 280, said process container being filled with a cleaning medium bath 432, so contamination of the cleaning medium bath 432 and a recontamination of the workpiece 196 caused thereby is avoided.

The workpiece 196 may be held during the ultrasonic cleaning process by means of the handling apparatus 192 in the interior 112 of the process container 100 and optionally moved, for example rotated and/or moved up and down, by means of the handling apparatus 192 relative to the ultrasound oscillator 280.

Figure 26:
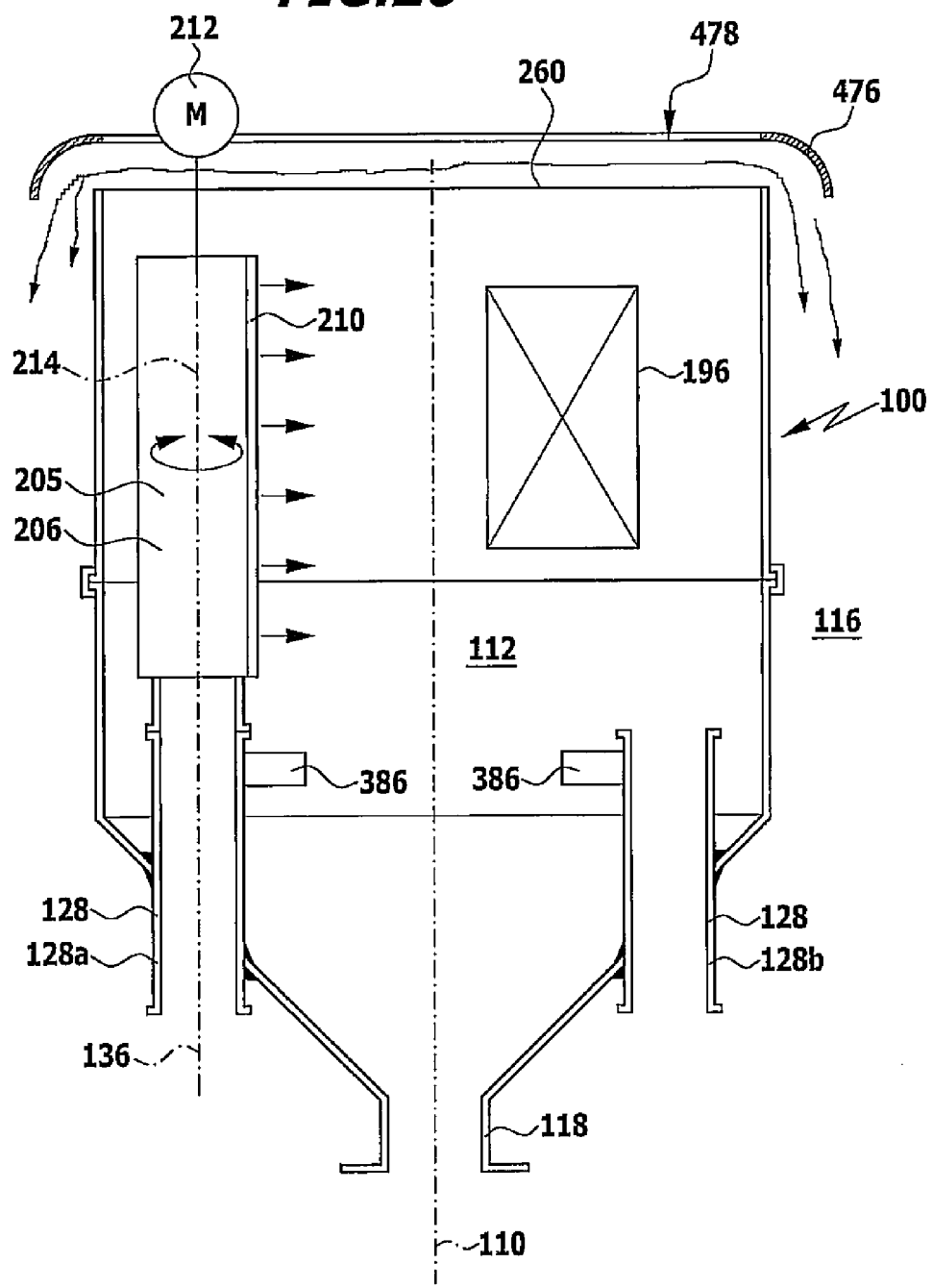
FIG. 26 shows a schematic section through a process container with a treatment unit arranged therein for carrying out a spray cleaning process and with a guide plate for avoiding over-spray.

An alternative configuration of the process container 100 shown in FIG. 26 serves to carry out a spray cleaning process on a workpiece 196, which is arranged in the interior 112 of the process container 100, an escape of fluid (for example an aqueous cleaning agent, an oil, a cooling lubricant, a hydrocarbon etc.) being prevented in a region above the process container 100 by a guide plate 476.

For this purpose, a movable nozzle system 208 is adapted to the first upper medium passage 128a, as the process element 205 and treatment unit 206, on the interior side.

The movable nozzle system 208 comprises a slit nozzle 210, which is rotatable by means of a motor, pneumatic or hydraulic rotary drive 212 about a rotational axis 214 preferably coinciding with the longitudinal centre axis 136 of the upper medium passage 128a.

A cleaning medium jet directed onto the workpiece 196 is producible in the process container 100 filled with a bath of the cleaning medium by means of the slit nozzle 210.

Cleaning medium overflowing at the upper edge 260 of the process container 100, optionally with contamination contained therein, is reflected back from the guide plate 476 into the interior 112 of the process container 100 or downwardly against the external wall of the process container 100, so that this cleaning medium does not reach the region above the guide plate 476.

The guide plate 476 is annular and has, viewed from the interior 112 of the process container 100, a concave curvature.

The guide plate 476 surrounds a central through-opening 478, through which the workpiece 196 is introducible into the interior 112 of the process container 100 by means of the handling apparatus 192.

Figure 27:
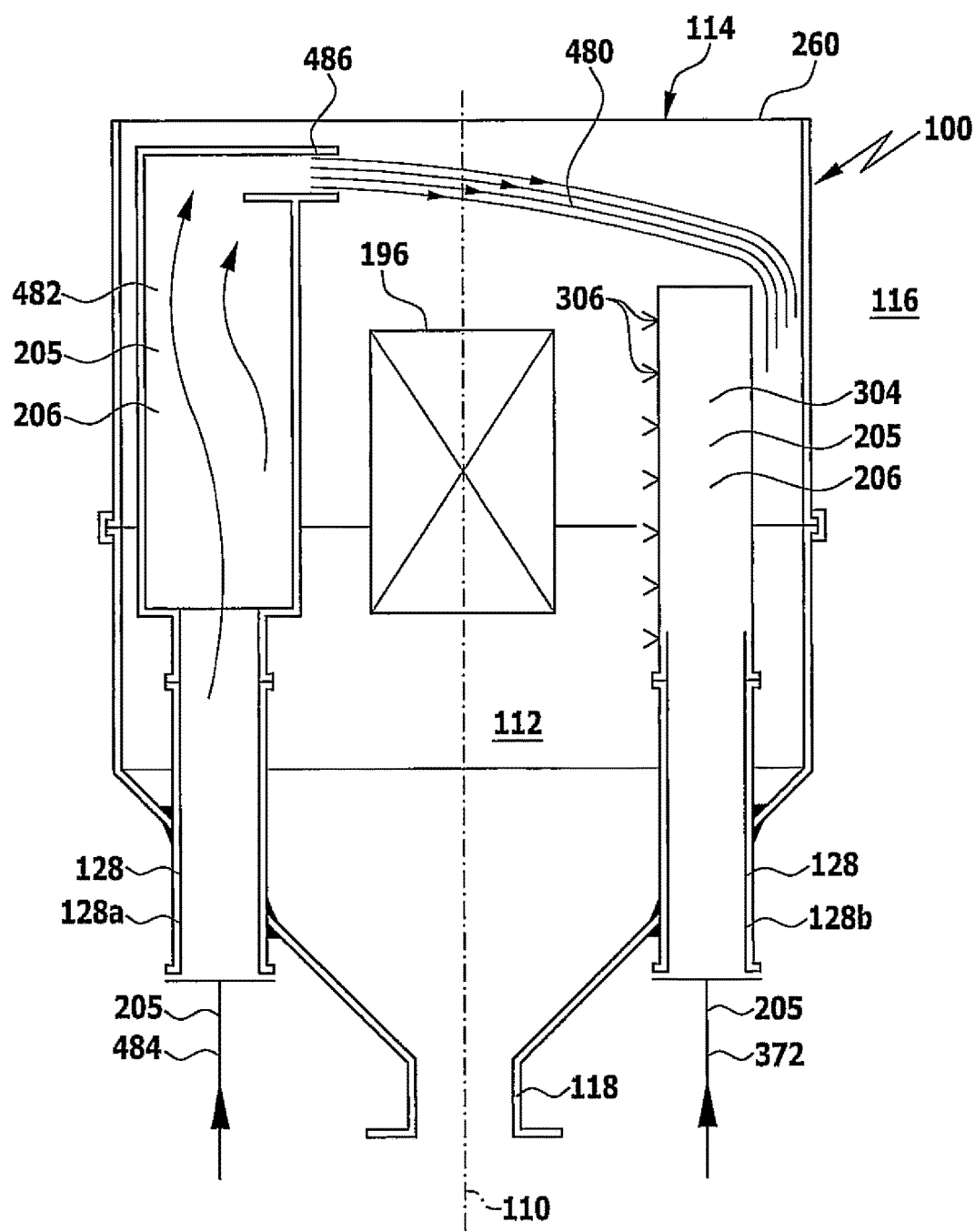
FIG. 27 shows a schematic section through a process container with treatment units arranged therein for carrying out a spray cleaning process with simultaneous generation of a water curtain to avoid over-spray.

An alternative configuration of the process container 100 shown in FIG. 27 serves to carry out a spray cleaning process on a workpiece 196, which is arranged in the interior 112 of the process container 100, a liquid curtain 480 being generated, which prevents cleaning medium over-spray arriving from the interior 112 of the process container 100 through the access opening 114 at the outside.

For this purpose, a spray nozzle system 304 with a plurality of spray nozzles 306 is adapted to the second upper medium passage 128b, as the process element 205 and treatment unit 206, on the interior side.

On the exterior side, a process fluid feed line 372 is adapted to the second upper medium passage 128b as the process element 205.

Process fluid jets directed from the process fluid against the workpiece 196 are producible by means of the spray nozzles 306 of the spray nozzle system 304.

A liquid curtain generator 482 is adapted to the first upper medium passage 128a in this configuration of the process container 100 on the interior side, as the process element 205 and treatment unit 206.

On the exterior side, a liquid feed line 484 is adapted to the first upper medium passage 128a, as the process element 205.

The liquid curtain generator 482 comprises a slit nozzle 486 on its upper end, by means of which a liquid curtain 480 is producible from the liquid fed, said liquid curtain extending from the slit nozzle 486 over the workpiece 196 located in the treatment position and over the spray nozzle system 304, so that the workpiece 196 is separated by the liquid curtain 480 from the access opening 114 at the upper edge 260 of the process container 100.

By atomising the process fluid jets on the surface of the workpiece 196, process fluid overspray being produced is held back by the liquid curtain 480 in the interior 112 of the process container 100 and therefore does not reach the exterior 116 of the process container 100.

Rather, the entire excess process fluid, together with the liquid used for the liquid curtain 480, discharges through the lower medium passage 118 from the interior 112 of the process container 100.

Figure 28:
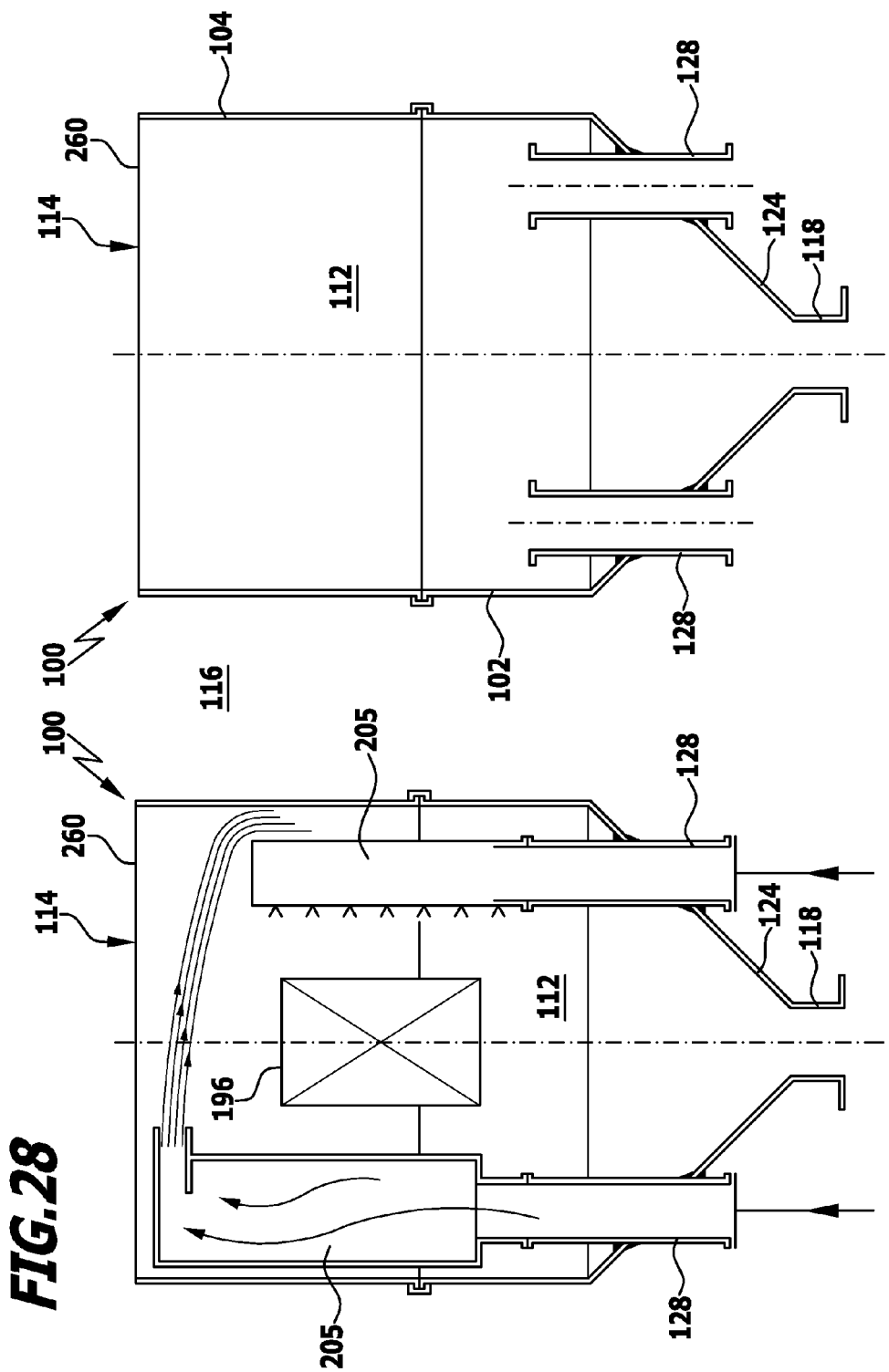
FIG. 28 shows a schematic vertical section through the process container of FIG. 1 in combination with a schematic section through the process container of FIG. 27 including treatment units arranged therein.

An alternative example configuration utilizing a combination of process containers 100 is shown in FIG. 28. FIG. 28 shows at least a first and a second process container for carrying out a cleaning process, a drying process, a deburring process, a coating process and/or a coating removal process on a workpiece 196 in the interior 112 of the process container 100. Each of the process first and second process containers 100 includes a wall delimiting the interior 112 of the process container 100. The process containers 100 each include at least one medium passage 128, by which a medium is guidable through the wall of the process container 100. While the example of FIG. 28 pertains to a spray cleaning process, other configurations or uses are possible.

The invention claimed is:

1. Process container for carrying out a treatment process comprising a cleaning process, a drying process, a deburring process, a coating process and/or a coating removal process on a workpiece in the interior of the process container, comprising a wall delimiting the interior of the process container,
- wherein the process container comprises at least one medium passage, by means of which a medium is guidable through the wall of the process container,
- said at least one medium passage having an interior-side adapter arranged in the interior of the process container, said interior-side adapter being configured to selectively connect to one of a plurality of respective adapters of at least two different process elements of different types, wherein the adapters of the at least two different process elements are identical to one another,
- wherein the process container comprises a container lower part and a container upper part removably placed on the container lower part,
- wherein the at least one medium passage extends through a wall of the container lower part,
- wherein the process container has an open access opening, which is arranged at an upper edge of the container upper part and on an upper side of the process container, by means of which the interior of the process container surrounded by the container lower part and the container upper part is accessible from an exterior of the process container and through which a workpiece held on a handling apparatus is introducible into the interior of the process container for the treatment process and removable from the process container after the treatment process, and
- wherein the process container comprises, in addition to the container lower part and the container upper part, a receiving element, by means of which the process container is supportable on an external bearing arrangement,
- wherein the receiving element has a container through-opening through which the container lower part passes, the container lower part extending through the container through-opening, and at least one medium through-opening for a passage of a medium through the receiving element to at least one of the at least one medium passage of the process container.

2. Process container according to claim 1, wherein at least one of the at least one medium passage has a dead space-free adapter to adapt a process element of said at least two process elements.

3. Process container according to claim 1, wherein the process container comprises at least two medium passages, which have adapters that are identical to one another.

4. Process container according to claim 1, wherein the process container comprises two or more medium passages.

5. Process container according to claim 4, wherein at least two of the medium passages are arranged at substantially constant angular spacings with respect to a vertical centre axis of the process container.

6. Process container according to claim 1, wherein one of the at least one medium passage at a lowest point of the interior of the process container opens into the interior of the process container.

7. Process container according to claim 1, wherein the container upper part is connected to the container lower part of the process container by means of a dead space-free sealing arrangement.

8. Process container according to claim 1, wherein the wall of the process container, at least on its inside, at least in portions, has a surface roughness of less than 0.8 µm.

9. Process container according to claim 1, wherein at least one of the at least one medium passage has an adapter arranged outside the interior of the process container to adapt the receiving element to the medium passage.

10. Combination of
- at least one process container for carrying out a treatment process comprising a cleaning process, a drying process, a deburring process, a coating process and/or a coating removal process on a workpiece in the interior of the process container, comprising a wall delimiting the interior of the process container,
- wherein the process container comprises at least one medium passage, by means of which a medium is guidable through the wall of the process container,
- said at least one medium passage having an interior-side adapter arranged in the interior of the process container, said interior-side adapter being configured to selectively connect to one of a plurality of respective adapters of at least two different process elements of different types, wherein the adapters of the at least two different process elements are identical to one another,
- wherein the process container comprises a container lower part and a container upper part removably placed on the container lower part,
- wherein the at least one medium passage extends through a wall of the container lower part,
- wherein the process container has an open access opening, which is arranged at an upper edge of the container upper part and on an upper side of the process container, by means of which the interior of the process container surrounded by the container lower part and the container upper part is accessible from an exterior of the process container and through which a workpiece held on a handling apparatus is introducible into the interior of the process container for the treatment process and removable from the process container after the treatment process, and
- wherein the process container comprises, in addition to the container lower part and the container upper part, a receiving element, by means of which the process container is supportable on an external bearing arrangement,
- wherein the receiving element has a container through-opening through which the container lower part passes, the container lower part extending through the container through-opening, and at least one medium through-opening for a passage of a medium through the receiving element to at least one of the at least one medium passage of the process container,
- and said at least two process elements of different types, which are selectively adaptable to the same medium passage of the process container.

11. Combination according to claim 10, wherein the combination furthermore comprises said handling apparatus for introducing said workpiece to be treated into the interior of at least one of the process containers.

12. Combination according to claim 10, wherein the combination comprises, as a process element of said at least two different process elements, a spray-cleaning unit, an injection flood washing unit, an ultrasonic cleaning unit, a high pressure deburring unit, a brush deburring unit, a blow drying unit, a steam cleaning unit, a suction unit, a ventilation unit, a workpiece receiver, a workpiece movement unit and/or a liquid curtain generating unit.

13. Combination of
at least a first and a second process container for carrying out a treatment process comprising a cleaning process, a drying process, a deburring process, a coating process and/or a coating removal process on a workpiece in the interior of the first or second process container, each of the first and second process containers comprising a wall delimiting the interior of the process container,
wherein the process container comprises at least one medium passage, by means of which a medium is guidable through the wall of the process container,
said at least one medium passage having an interior-side adapter arranged in the interior of the process container, said interior-side adapter being configured to selectively connect to one of a plurality of respective adapters of at least two different process elements of different types, wherein the adapters of the at least two different process elements are identical to one another,
wherein the process container comprises a container lower part and a container upper part removably placed on the container lower part,
wherein the at least one medium passage extends through a wall of the container lower part,
wherein the process container has an open access opening, which is arranged at an upper edge of the container upper part and on an upper side of the process container, by means of which the interior of the process container surrounded by the container lower part and the container upper part is accessible from an exterior of the process container and through which a workpiece held on a handling apparatus is introducible into the interior of the process container for the treatment process and removable from the process container after the treatment process, and
wherein the first and second process containers each comprise, in addition to the container lower part and the container upper part, a receiving element, by means of which the first or second process container is supportable on an external bearing arrangement,
wherein the receiving element has a container through-opening through which the container lower part passes, the container lower part extending through the container through-opening, and at least one medium through-opening for a passage of a medium through the receiving element to at least one of the at least one medium passage of the first or second process container,
and at least one process element of said at least two different process elements, which is selectively adaptable to a medium passage of the first process container or to a medium passage of the second process container.

* * * * *